(12) United States Patent
Kang et al.

(10) Patent No.: US 11,500,498 B2
(45) Date of Patent: Nov. 15, 2022

(54) FOLDABLE DISPLAY DEVICE

(71) Applicant: LG Display Co., Ltd., Seoul (KR)

(72) Inventors: Sinchul Kang, Gimpo-si (KR); Miyeon Seo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/115,594

(22) Filed: Dec. 8, 2020

(65) Prior Publication Data

US 2021/0200381 A1 Jul. 1, 2021

(30) Foreign Application Priority Data

Dec. 30, 2019 (KR) .................. 10-2019-0177644

(51) Int. Cl.
*G06F 3/044* (2006.01)
*B32B 27/30* (2006.01)
(Continued)

(52) U.S. Cl.
CPC .............. *G06F 3/0446* (2019.05); *B32B 7/12* (2013.01); *B32B 27/308* (2013.01);
(Continued)

(58) Field of Classification Search
CPC ................. G06F 3/0446; G06F 3/0443; G06F 2203/04102; G06F 2203/04111; G06F 2203/04112; G06F 3/0412; G06F 1/1652; G06F 3/041; G06F 21/84; B32B 7/12; B32B 27/308; B32B 2457/208; B32B 17/10; B32B 2307/42; B32B 3/30; B32B 27/06; B32B 27/08; B32B 27/281; B32B 27/306; B32B 27/325; B32B 27/36; B32B 27/365; H01L 27/3244; H01L 51/0097;
(Continued)

(56) References Cited

U.S. PATENT DOCUMENTS

2016/0357052 A1\* 12/2016 Kim .................. G06F 1/1652
2016/0364044 A1   12/2016 Kim et al.
(Continued)

FOREIGN PATENT DOCUMENTS

CN         106875845 A     6/2017
CN         107479754 A    12/2017
(Continued)

*Primary Examiner* — Grant Sitta
(74) *Attorney, Agent, or Firm* — Seed IP Law Group LLP

(57) ABSTRACT

A foldable display device according to the present disclosure includes a display panel including a display area and a non-display area, a touch panel disposed on the display panel and including a bridge electrode, a plurality of insulating layers, a first touch electrode, and a second touch electrode. The device includes a plurality of crack stoppers disposed in the non-display area of the touch panel and configured by patterning the insulating layers and an adhesive layer. The adhesive layer fills a space between the plurality of crack stoppers from which the insulating layers are removed, and is disposed between the display panel and the touch panel. Accordingly, crack occurrence may be suppressed even if a folding/unfolding operation of the foldable display device is repeated. Thus, crack occurrence in the foldable display device may be improved and at the same time, folding characteristics may increase.

25 Claims, 13 Drawing Sheets

(51) Int. Cl.
*B32B 7/12* (2006.01)
*H01L 27/32* (2006.01)

(52) U.S. Cl.
CPC ...... *G06F 3/0443* (2019.05); *B32B 2457/208* (2013.01); *G06F 2203/04102* (2013.01); *G06F 2203/04111* (2013.01); *G06F 2203/04112* (2013.01); *H01L 27/3244* (2013.01); *H01L 2251/5338* (2013.01)

(58) Field of Classification Search
CPC ... H01L 27/323; H01L 51/5253; G09F 9/301; Y02E 10/549
See application file for complete search history.

(56) References Cited

U.S. PATENT DOCUMENTS

| 2018/0095574 | A1* | 4/2018 | Kim | G06F 1/1652 |
| 2018/0188861 | A1* | 7/2018 | Wu | H01L 25/167 |
| 2021/0328171 | A1* | 10/2021 | Wang | H01L 51/525 |

FOREIGN PATENT DOCUMENTS

| CN | 107863376 A | 3/2018 |
| CN | 107885381 A | 4/2018 |
| CN | 109727535 A | 5/2019 |
| CN | 109857272 A | 6/2019 |
| CN | 110391277 A | 10/2019 |
| KR | 10-2014-0061897 A | 5/2014 |
| KR | 10-2017-0095809 A | 8/2017 |

\* cited by examiner

FOLDABLE DISPLAY DEVICE

CROSS-REFERENCE TO RELATED APPLICATIONS

This application claims the priority and benefit of Korean Patent Application No. 10-2019-0177644 filed on Dec. 30, 2019, with the Korean Intellectual Property Office, the disclosure of which is incorporated herein by reference.

BACKGROUND

Technical Field

The present disclosure relates to a foldable display device and more particularly, to a foldable display device including a touch panel.

Description of the Related Art

Image display devices for displaying a variety of information on a screen are one of the core technologies of the information and communication era, and include a cathode ray tube display panel, a liquid crystal display panel, an electrophoretic display panel, an organic light emitting display panel, and the like.

In particular, to realize image display devices to be thinner, lighter, and more portable, and furthermore to have a high performance, organic light emitting display panels, and the like for displaying an image by controlling a light emission amount of a light emitting element have recently received considerable attention.

Such an organic light emitting display panel is a self-light emitting display panel, and may be manufactured to be light and thin since it does not require a separate light source. In addition, since the organic light emitting display panel can be manufactured to be thin, it can be easily implemented as a foldable display device.

Meanwhile, the recent electronic devices are composed of a display device including a touch panel capable of recognizing a user's touch. The touch panel is a type of input device that is installed on a display screen of an electronic device (or an information device) and allows a user to input information by touching the screen with a finger or pen while watching the display screen.

BRIEF SUMMARY

A display panel constituting a foldable display device may be folded by including a substrate having flexibility. The display panel including a flexible substrate may be easily folded, but cracks may occur at an edge of the display panel when folding.

In particular, there is a problem that cracks and delamination occur between a touch insulating layer and an interlayer insulating layer of a touch panel that is added to the display panel.

Accordingly, the inventors of the present disclosure have recognized the necessity of suppressing cracks from occurring in a display device, in particular, in a touch panel, due to folding, while easily folding the display device, in order to implement a foldable display device including the touch panel. Thus, the inventors of the present disclosure have invented a foldable display device allowing for suppression of crack occurrence in a touch panel, while being easily folded.

Technical benefits of the present disclosure are not limited to the above-mentioned benefits, and other benefits, which are not mentioned above, can be clearly understood by those skilled in the art from the following descriptions.

According to an aspect of the present disclosure, a foldable display device may include a display panel divided into a folding area and a non-folding area, and a display area and a non-display area; a touch panel disposed on the display panel and including a bridge electrode, a plurality of insulating layers, a first touch electrode, and a second touch electrode; a plurality of crack stoppers disposed in the non-display area of the touch panel and configured by patterning the insulating layers; and an adhesive layer filling a space between the plurality of crack stoppers from which the insulating layers are removed, the adhesive layer being disposed between the display panel and the touch panel.

According to another aspect of the present disclosure, a foldable display device may include a display panel divided into a folding area and a non-folding area, and a display area and a non-display area; a touch panel disposed on the display panel and including a plurality of insulating layers; a plurality of crack stoppers disposed in the non-folding area of the non-display area of the touch panel, and configured by patterning the insulating layers; an open area disposed in the folding area of the non-display area of the touch panel, and exposing another insulating layer by entirely removing at least one insulating layer of the plurality of insulating layers; and an adhesive layer filling a space between the plurality of crack stoppers and the open area, the adhesive layer being disposed between the display panel and the touch panel.

Other detailed matters of the embodiments are included in the detailed description and the drawings.

In a foldable display device according to an embodiment of the present disclosure, a photo acryl which is an organic layer is used as an interlayer insulating layer of a touch panel to thereby reduce folding stress, and a crack stopper is applied to an edge of the touch panel, so that crack occurrence is suppressed even if a folding/unfolding operation of the foldable display device is repeated.

Thus, crack occurrence in the foldable display device may be improved and at the same time, folding characteristics may increase.

The technical benefits according to the present disclosure are not limited to the contents exemplified above, and more various benefits are included in the present disclosure.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
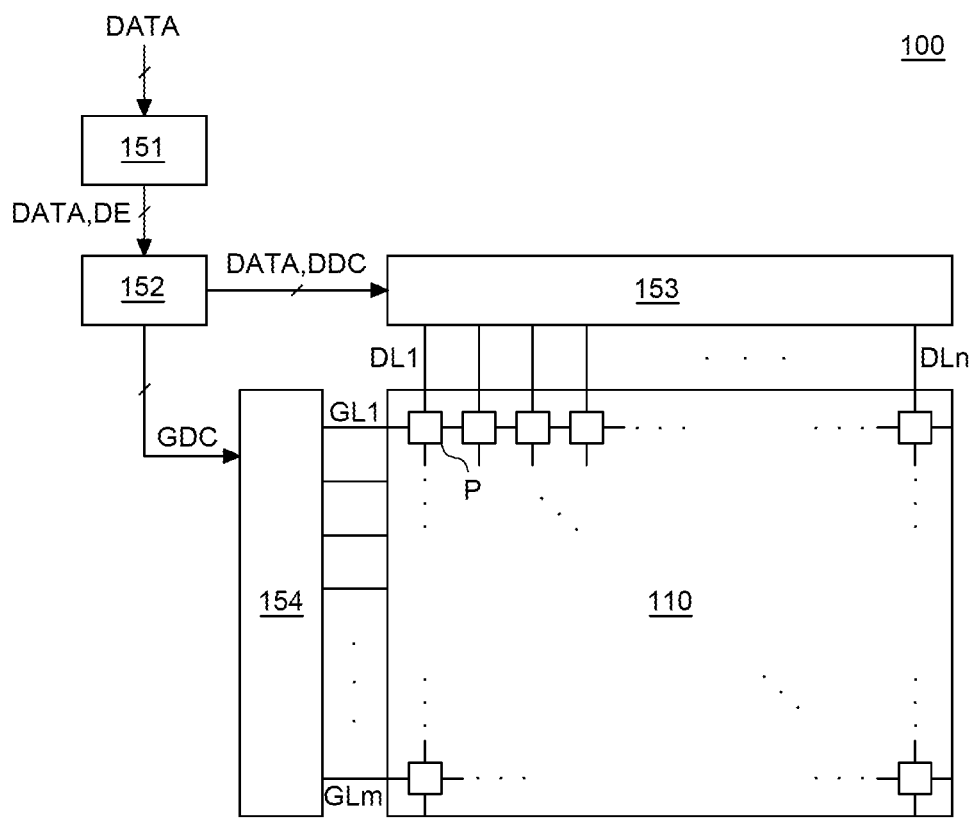
FIG. 1 is a block diagram of a foldable display device according to a first embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, it may be directly disposed on another element or layer, or another layer or another element may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a foldable display device according to embodiments of the present disclosure will be described in detail with reference to accompanying drawings.

FIG. 1 is a block diagram of a foldable display device according to a first embodiment of the present disclosure.

With reference to FIG. 1, a foldable display device 100 according to a first embodiment of the present disclosure may include an image processing unit 151, a timing controller 152, a data driver 153, a gate driver 154, and a display panel 110.

The image processing unit 151 may output a data signal DATA and a data enable signal DE that are supplied from the outside. The image processing unit 151 may output one or more of a vertical synchronization signal, a horizontal synchronization signal, and a clock signal, in addition to the data enable signal DE.

The timing controller 152 receives the data enable signal DE or the data signal DATA, along with a driving signal including the vertical synchronization signal, the horizontal synchronization signal, the clock signal and the like, from the image processing unit 151. The timing controller 152 may outputs a gate timing control signal GDC for controlling an operation timing of the gate driver 154 and a data timing control signal DDC for controlling an operation timing of the data driver 153 based on the driving signal.

The data driver 153 samples and latches the data signal DATA supplied from the timing controller 152 in response to the data timing control signal DDC supplied from the timing controller 152, and converts the data signal DATA into a gamma reference voltage to output it. The data driver 153 may output the data signal DATA through data lines DL1 to DLn.

The gate driver 154 may output a gate signal while shifting a level of the gate voltage in response to the gate timing control signal GDC supplied from the timing controller 152. The gate driver 154 may output the gate signal through gate lines GL1 to GLm.

The display panel 110 may display an image while a sub-pixel P emits light in response to the data signal DATA and the gate signal supplied from the data driver 153 and the gate driver 154. A detailed structure of the sub-pixel P will be described in detail in FIGS. 2 and 5.

The foldable display device 100 according to the first embodiment of the present disclosure may be configured as a display device including a touch panel (not shown) capable of recognizing a user's touch. The touch panel is a type of input device that is installed on a display screen of an electronic device (or an information device), that is, on a front surface of the display panel 110, and allows a user to input information by touching the screen with a finger or pen while watching the display screen. A detailed structure of the touch panel will be described in detail in FIG. 5.

Figure 2:
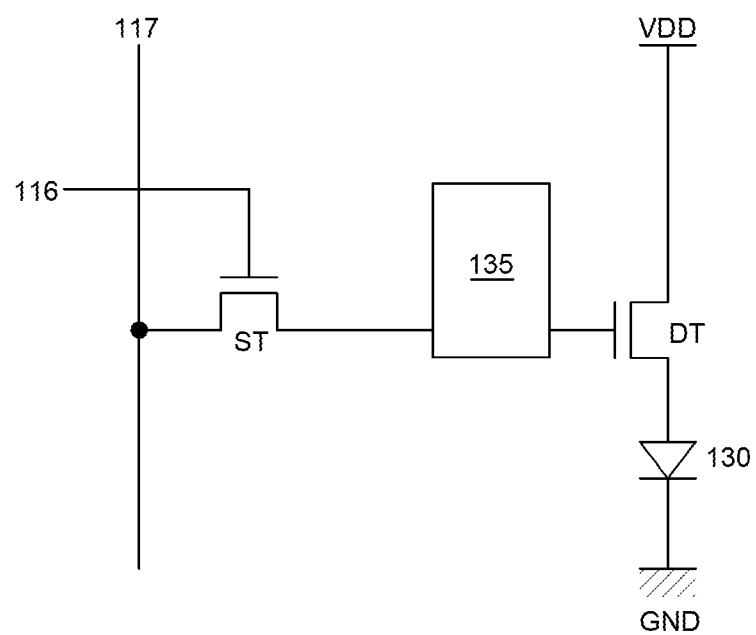
FIG. 2 is a circuit diagram of a sub-pixel included in the foldable display device.

FIG. 2 is a circuit diagram of a sub-pixel included in the foldable display device.

With reference to FIG. 2, the sub-pixel of the foldable display device according to the first embodiment of the present disclosure may include a switching transistor ST, a driving transistor DT, a compensation circuit 135, and a light emitting element 130.

The light emitting element 130 may operate to emit light according to a driving current formed by the driving transistor DT.

The switching transistor ST may perform a switching operation such that a data signal supplied through a data line 117 in response to the gate signal supplied through a gate line 116 is stored as a data voltage in a capacitor.

The driving transistor DT may operate such that a constant driving current flows between a high potential power line VDD and a low potential power line GND in response to the data voltage stored in the capacitor.

The compensation circuit 135 is a circuit for compensating for a threshold voltage or the like of the driving transistor DT, and the compensation circuit 135 may include one or more thin film transistors and capacitors. A configuration of the compensation circuit 135 may vary according to a compensation method.

The sub-pixel shown in FIG. 2 is configured to have a 2T (Transistor) 1C (Capacitor) structure including a switching transistor ST, a driving transistor DT, a capacitor, and a light emitting element 130. However, the sub-pixel may have various structures, such as 3T1C, 4T2C, 5T2C, 6T1C, 6T2C, 7T1C, 7T2C, and the like when the compensation circuit 135 may be added thereto.

Figure 3:
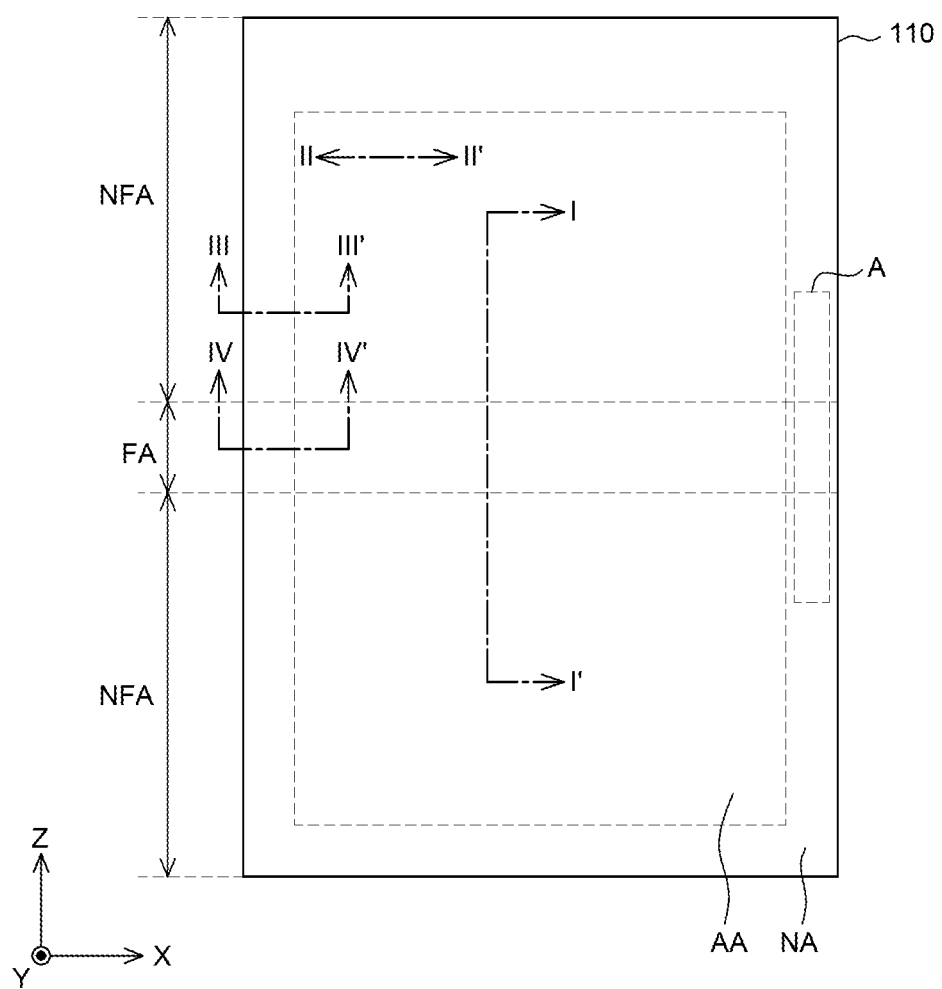
FIG. 3 is a plan view of the foldable display device according to the first embodiment of the present disclosure.

FIG. 3 is a plan view of the foldable display device according to the first embodiment of the present disclosure.

In FIG. 3, for convenience of description, only the display panel 110 among various components of the foldable display device 100 is illustrated. In addition, FIG. 3 exemplifies a state in which the display panel 110 of the foldable display device 100 according to the first embodiment of the present disclosure is not folded.

With reference to FIG. 3, the display panel 110 is a panel on which an image is implemented. The light emitting element for implementing an image, and circuits, wires, and components for driving the light emitting element may be disposed in the display panel 110.

A substrate of the display panel 110 is a base member for supporting various components of the display panel 110 and may be formed of an insulating material. For example, the substrate may be formed of a plastic material such as polyimide, but is not limited thereto.

The display panel 110 may be divided into a display area AA and a non-display area NA, and may be divided into a folding area FA, and a non-folding area NFA.

The display area AA is an area where an image is displayed, and a plurality of pixels including light emitting elements may be arranged in the display area AA. The light emitting element for displaying an image and a circuit unit for driving the light emitting element may be disposed in the display area AA. In the present disclosure, for convenience of description, it is assumed that the foldable display device 100 includes the display panel 110 including a light emitting element, but embodiments are not limited thereto. Types of the display panel 110 may include various display panels such as an organic light emitting display panel, a liquid crystal display panel, a plasma display panel, and an electrophoretic display panel.

The circuit unit may include various thin film transistors, capacitors, and wires for driving the light emitting element. For example, the circuit unit may include various components such as a driving thin film transistor, a switching thin film transistor, a storage capacitor, a gate line, a data line and the like, but is not limited thereto.

The non-display area NA is an area where an image is not displayed. In the non-display area NA, circuits, wires, components, and the like for driving the light emitting element of the display area AA are disposed. Various ICs such as gate driver ICs and data driver ICs, and driving circuits may be disposed in the non-display area NA. For example, various ICs and driving circuits are mounted as a gate in panel (GIP) type in the non-display area NA of the display panel 110 or may be connected to the display panel 110 in a method such as a tape carrier package (TCP) or a chip on film (COF).

Meanwhile, the display panel 110 may be defined as the display area AA and the non-display area NA, but may also be defined as a folding area FA and a non-folding area NFA.

The folding area (or a folding portion or folding region) FA is an area where the display panel 110 is folded when the foldable display device 100 is folded. The folding area FA includes a portion of the display area AA and a portion of the non-display area NA. In an embodiment of the present disclosure, it is exemplified that the folding area FA includes a portion of the display area AA and a portion of the non-display area NA. However, embodiments are not limited thereto. The non-display area NA may be disposed only in a portion outside the display area AA. In this case, the folding area FA may include only a portion of the display area AA.

The folding area FA may be folded along a specific radius of curvature with respect to a folding axis.

Specifically, the folding axis may be an X-axis. When the folding area FA is folded with respect to the folding axis, the folding area FA may form a portion of a curve, a circle, or an ellipse. The radius of curvature of the folding area FA means a radius of a curve, circle, or ellipse corresponding to a portion of the curve, circle, or ellipse formed by the folding area FA. In an embodiment of the present disclosure, it is exemplified that a folding axis in the X-axis direction is located in the folding area FA, and the non-folding area NFA extends in a Y-axis direction from the folding area FA and is perpendicular to the folding axis. However, embodiments are not limited thereto.

Also, the non-folding area (or a non-folding portion or non-folding region) NFA is an area where the display panel 110 is not folded when the foldable display device 100 is folded. That is, the non-folding area NFA is an area where the display panel 110 is maintained in a substantially planar state when the foldable display device 100 is folded. The non-folding area NFA may include a portion of the display area AA and a portion of the non-display area NA.

The non-folding area NFA may be an area located on both sides of the folding area FA. That is, the non-folding area NFA may be an area extending in the Y-axis direction with respect to the folding axis. In this case, the folding area FA may be defined between the non-folding areas NFA. Accordingly, when the display panel 110 is folded with respect to the folding axis, the non-folding areas NFA may face each other. However, embodiments are not limited thereto.

Various wires may be formed in the display panel 110.

The wires may be formed in the display area AA of the display panel 110, or the wires formed in the non-display area NA may connect a gate driver IC, a data driver IC, a driving circuit and the like to each other to transfer a signal.

The wires may be formed of a conductive material, and may be formed of a conductive material having excellent ductility in order to reduce the occurrence of cracks during folding of the display panel 110.

The wires may be formed of a conductive material having excellent ductility such as gold (Au), silver (Ag), or aluminum (Al), or may be formed of one of various conductive materials used in the display area AA. The wires may also be formed of molybdenum (Mo), chromium (Cr), titanium (Ti), nickel (Ni), neodymium (Nd), copper (Cu), or alloys of silver (Ag) and magnesium (Mg).

The wires may be formed of a multilayer structure including various conductive materials, and may be formed of a three-layer structure of titanium (Ti)/aluminum (Al)/titanium (Ti), but embodiments are not limited thereto.

The wire formed in the folding area FA receives tensile force when folded. The wire extending in the same direction as a folding direction receives the highest tensile force, so that cracks or disconnection may occur. Therefore, rather than forming the wire to extend in the folding direction, at least a portion of the wire disposed in the folding area FA is formed to extend in a diagonal direction, which is a direction different from the folding direction, so that the tensile force may be reduced or minimized.

The wire disposed to be included in the folding area FA may be variously shaped, and may be formed in a shape such as a trapezoidal wave shape, a triangular wave shape, a sawtooth wave shape, a sinusoidal wave shape, an omega (Ω) shape, a rhombus shape, or the like.

Figure 4:
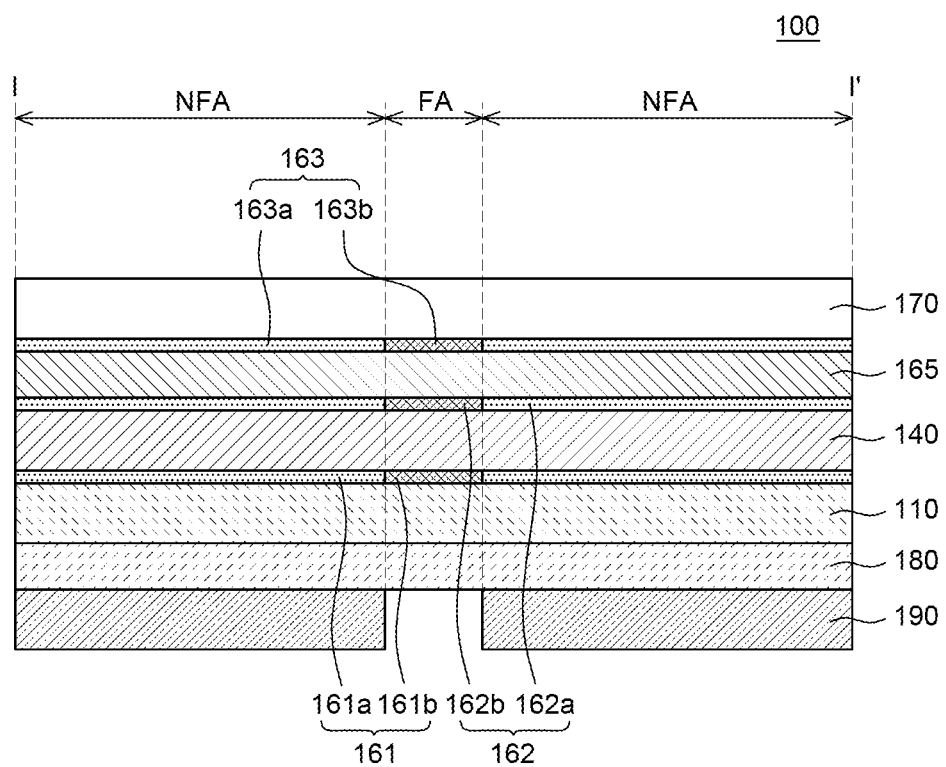
FIG. 4 is a cross-sectional view taken along line I-I' of FIG. 3.

A more detailed description of the folding area FA, the non-folding area NFA, and other components of the foldable display device 100 will be provided with reference to FIG. 4.

FIG. 4 is a cross-sectional view taken along line I-I' of FIG. 3.

FIG. 4 illustrates other components in addition to the display panel 110.

With reference to FIG. 4, the foldable display device 100 according to the first embodiment of the present disclosure may be configured to include the display panel 110, a touch panel 140, adhesive layers 161, 162, and 163, a polarizing plate 165, and a cover member 170.

The touch panel 140 may be disposed on the display panel 110.

The touch panel 140 may perform a touch function capable of inputting user information. The touch panel 140 is an input device capable of inputting information by directly contacting a screen with a finger or a pen. The touch panel 140 may be a capacitive-type panel or resistive film-type panel. As illustrated in FIG. 4, the touch panel 140 may be an add-on type touch panel that is manufactured independently of the display panel 110 and then, disposed on the display panel 110, but is not limited thereto. Alternatively, the touch panel 140 may be an in-cell type touch panel embedded in a sub-pixel of the display panel 110 or an on-cell type touch panel formed on an upper portion of the display panel 110.

The polarizing plate 165 may be disposed on the touch panel 140.

The polarizing plate 165 means an optical member capable of polarizing incident light. Accordingly, the polarizing plate 165 may prevent visibility of a screen from being lowered due to reflection of external light. The polarizing plate 165 may be formed of polyvinyl alcohol (PVA), but is not limited thereto.

The cover member 170 may be disposed on the polarizing plate 165.

The cover member 170 protects the display panel 110 from external shock, prevents damage such as scratches and the like, and transmits light emitted from the display panel 110 to thereby allow an image displayed on the display panel 110 to be visible externally. In addition, the cover member 170 may be formed of a material having impact resistance and light transmission properties.

For example, the cover member 170 may be formed of at least one of polycarbonate, cycloolefin polymer, polyethylene terephthalate (PET), polyimide (PI), and glass.

A back plate 180 may be disposed under the display panel 110.

When the substrate included in the display panel 110 is formed of a plastic material such as polyimide, a manufacturing process of the foldable display device 100 is conducted in a situation in which a support substrate formed of glass is disposed under the substrate. After forming components such as the touch panel 140 and the polarizing plate 165 on an upper portion of the display panel 110, the support substrate may be released (or removed). However, since a component for supporting the substrate is required even after the support substrate is released, the back plate 180 for supporting the substrate may be disposed under the substrate.

In FIG. 4, the display panel 110 is illustrated as being disposed on the back plate 180, but an adhesive layer may be further disposed between the back plate 180 and the display panel 110.

A frame 190 may be disposed under the back plate 180.

The frame (or a rigid member or support member) 190 is a member for providing rigidity to the foldable display device 100 having flexible properties. Since components of the foldable display device 100 such as the display panel 110 and the like, have flexible properties, the foldable display device 100 may be implemented to be foldable.

The frame 190 may provide rigidity to the foldable display device 100 to support the display panel 110 and the like.

The frame 190 may include a hole to facilitate folding when the display panel 110 is folded, and may be formed only in an area corresponding to the non-folding area NFA.

In FIG. 4, the back plate 180 is disposed directly on the frame 190, but an adhesive layer may be further disposed between the frame 190 and the back plate 180.

With reference to FIG. 4, the foldable display device 100 may include the adhesive layers 161, 162, and 163.

The adhesive layers 161, 162, and 163 are applied and cured between the respective layers of the foldable display device 100 so that the respective layers are attached to each other. As the adhesive layers 161, 162, and 163, at least one of an optical transparent adhesive (OCA) and an optical transparent resin (OCR) may be used.

The first adhesive layer 161 is disposed between the display panel 110 and the touch panel 140, and the display panel 110 and the touch panel 140 may be bonded to each other through the first adhesive layer 161.

The second adhesive layer 162 is disposed between the touch panel 140 and the polarizing plate 165, and the touch panel 140 and the polarizing plate 165 may be bonded to each other through the second adhesive layer 162.

The third adhesive layer 163 is disposed between the polarizing plate 165 and the cover member 170, and the polarizing plate 165 and the cover member 170 may be bonded to each other through the third adhesive layer 163.

Each of the adhesive layers 161, 162, and 163 includes a first portion 161a, 162a, or 163a corresponding to the non-folding area NFA and a second portion 161b, 162b, or 163b corresponding to the folding area FA.

That is, the first adhesive layer 161 may include the first portion 161a corresponding to the non-folding area NFA and the second portion 161b corresponding to the folding area FA. The second adhesive layer 162 may include the first portion 162a corresponding to the non-folding area NFA and the second portion 162b corresponding to the folding area FA. The third adhesive layer 163 may include the first portion 163a corresponding to the non-folding area NFA and the second portion 163b corresponding to the folding area FA.

At this time, the second portion 161*b* of the first adhesive layer 161 may have a Young's modulus value smaller than a Young's modulus value of the first portion 161*a*. Also, the second portion 162*b* of the second adhesive layer 162 may have a Young's modulus value smaller than a Young's modulus value of the first portion 162*a*. Also, the second portion 163*b* of the third adhesive layer 163 may have a Young's modulus value smaller than a Young's modulus value of the first portion 163*a*. However, embodiments are not limited thereto.

The adhesive layers 161, 162, and 163 having a relatively small Young's modulus value in the folding area FA and the non-folding areas NFA may be used to alleviate stress generated when folding the foldable display device 100. However, when the adhesive layers 161, 162, and 163 having a relatively small Young's modulus value are applied to both the folding area FA and the non-folding area NFA, it may be disadvantageous in terms of rigidity of the foldable display device 100. Meanwhile, the adhesive layers 161, 162, and 163 having a relatively large Young's modulus value may be used in the folding area FA and the non-folding areas NFA. When the adhesive layers 161, 162, and 163 having a relatively large Young's modulus value are applied to both the folding area FA and the non-folding areas NFA, there is a limitation in solving the problem of stress generated during folding of the foldable display device 100.

In the foldable display device 100 according to the first embodiment of the present disclosure, portions of the first adhesive layer 161, the second adhesive layer 162, and the third adhesive layer 163 corresponding to the folding area FA may have a Young's modulus value relatively smaller than that of portions thereof corresponding to the non-folding areas NFA. At this time, since the portions corresponding to the non-folding areas NFA of the foldable display device 100 include the first portions 161*a*, 162*a*, and 163*a* having a relatively large Young's modulus value, rigidity of the foldable display device 100 may be maintained. Since the portions corresponding to the folding area FA of the foldable display device 100 include the second portions 161*b*, 162*b*, and 163*b* having a relatively small Young's modulus value, the foldable display device 100 can have excellent folding characteristics.

In addition, when folding the foldable display device 100, the first adhesive layer 161 may relieve stress acting between the display panel 110 and the touch panel 140. The second adhesive layer 162 may relieve stress acting between the touch panel 140 and the polarizing plate 165. The third adhesive layer 163 may relieve stress acting between the polarizing plate 165 and the cover member 170.

The foldable display device 100 may have a neutral plane.

The neutral plane means a virtual surface that is unstressed because compressive force (or compressive stress) and tensile force (or tensile stress) applied to a structure cancel each other when the structure is bent or folded. In this case, a position of the neutral plane may vary depending on components constituting the foldable display device 100. In this specification, it is exemplified that the neutral plane is positioned on the display panel 110 of the foldable display device 100, but embodiments are not limited thereto. Since the neutral plane is located on the display panel 110 of the foldable display device 100, as the foldable display device 100 is folded, tensile stress may act on a side surface of the display panel 110 positioned opposite to the folding direction based on the neutral plane. In addition, compressive stress acts on a side surface of the display panel 110 positioned in a direction in which the foldable display device 100 is folded.

Accordingly, when folding the display panel 110, in a case in which the portions of the first adhesive layer 161, the second adhesive layer 162, and the third adhesive layer 163 corresponding to the folding area FA have a high Young's modulus value, which is applied to the foldable display device 100, components disposed over and under the display panel 110 may receive an excessive stress. In other words, when the Young's modulus value corresponding to the folding area FA is large, the display panel 110, the touch panel 140, the adhesive layers 161, 162, and 163 and the polarizing plate 165 may receive a relatively large stress.

Accordingly, in the foldable display device 100 according to the first embodiment of the present disclosure, a pattern having a Young's modulus value relatively smaller than that of the non-folding areas NFA is formed in the folding area FA of the adhesive layers 161, 162, and 163, whereby stress generated by folding may be reduced or minimized.

The first adhesive layer 161, the second adhesive layer 162, and the third adhesive layer 163 are described as including the second portions 161*b*, 162*b*, 163*b* having a relatively small Young's modulus value and the first portions 161*a*, 162*a*, and 163*a* having a Young's modulus value relatively larger than that of the second portions 161*b*, 162*b*, 163*b*. However, embodiments are not limited thereto. Only some of the second portions 161*b*, 162*b*, 163*b* of the first adhesive layer 161, the second adhesive layer 162, and the third adhesive layer 163 may be configured to have a relatively small Young's modulus value.

In addition, the second portions 161*b*, 162*b*, and 163*b* may have an integral structure. In this case, the integral structure means that all areas of the second portions 161*b*, 162*b*, and 163*b* have a single Young's modulus value.

Specifically, some of the first adhesive layer 161, the second adhesive layer 162, and the third adhesive layer 163 may be configured such that the portions corresponding to the folding area FA have a Young's modulus value smaller than that of the portions corresponding to the non-folding areas NFA, as described above. However, some of the first adhesive layer 161, the second adhesive layer 162, and the third adhesive layer 163 may be configured such that the portions corresponding to the folding area FA have the same Young's modulus value as the portions corresponding to the non-folding areas NFA.

That is, even when only one of the plurality of adhesive layers 161, 162, and 163 disposed over the display panel 110 is configured such that the portion corresponding to the folding area FA has a Young's modulus value smaller than that of the portions corresponding to the non-folding areas NFA, it may be advantageous in terms of folding characteristics as compared to a case where all of the plurality of adhesive layers 161, 162, and 163 disposed over the display panel 110 are configured to have a single Young's modulus value.

Figure 5:
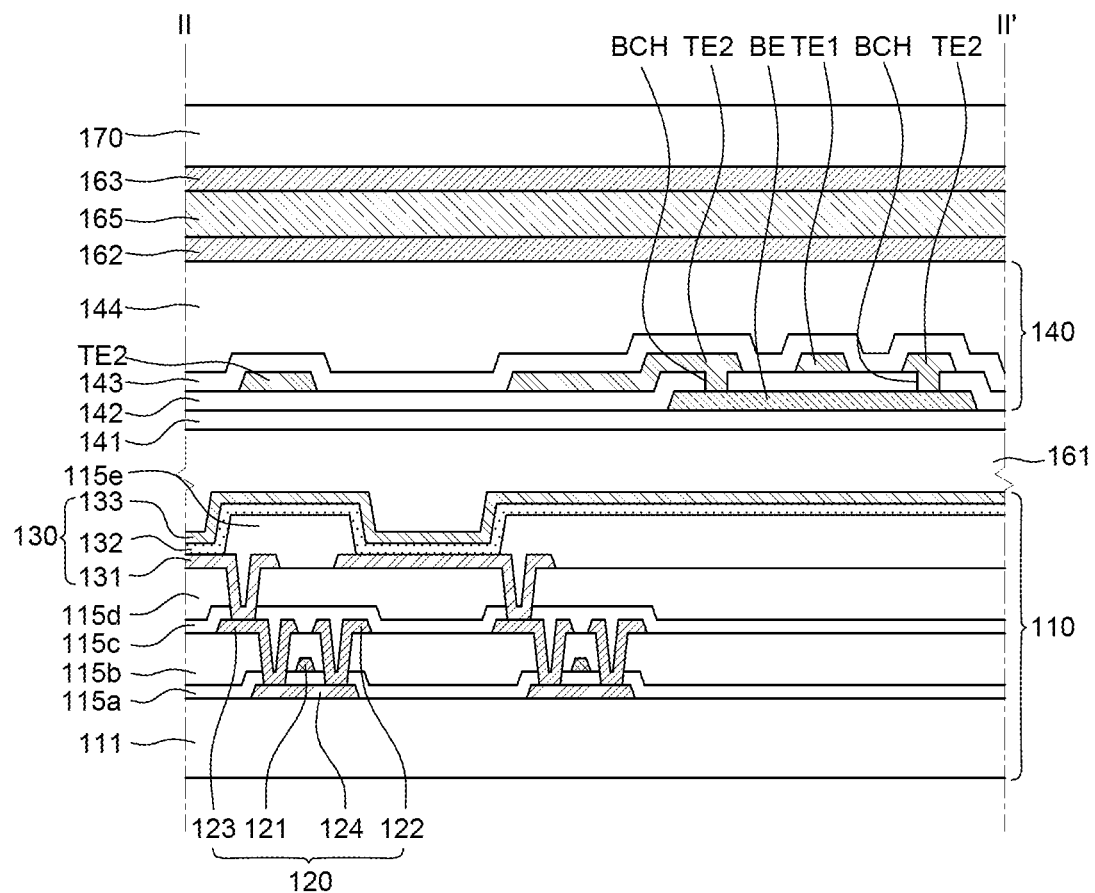
FIG. 5 is a cross-sectional view taken along line II-IF of FIG. 3.

FIG. 5 is a cross-sectional view taken along line II-IF of FIG. 3.

FIG. 5 is a cross-sectional view showing a detailed structure of the display area AA illustrated in FIG. 3.

With reference to FIG. 5, the foldable display device according to the first embodiment of the present disclosure may include the display panel 110, the touch panel 140, the polarizing plate 165, and the cover member 170.

A substrate 111 is a base substrate, and may include a plastic material or a glass material. Here, when the substrate 111 includes a plastic material, the substrate 111 may include an opaque or colored polyimide material. For example, the substrate 111 formed of a polyimide material may be obtained by curing a polyimide resin coated to have a predetermined thickness on a front surface of a release layer provided on a relatively thick carrier substrate. At this time, the carrier substrate may be separated from the substrate 111 by a release of the release layer using a laser release process.

Additionally, when the substrate 111 includes a plastic material, a back plate coupled to a rear surface of the substrate 111, based on a thickness direction of the substrate 111, may be further included. The back plate may maintain the substrate 111 in a planer state. For example, the back plate may include a polyethylene terephthalate material. The back plate may be laminated on the rear surface of the substrate 111 which is separated from the carrier substrate.

A buffer layer may be further disposed on one surface of the substrate 111. The buffer layer prevents penetration of moisture or other impurities from the outside through the flexible substrate 111 and may planarize a surface of the flexible substrate 111. The buffer layer is not necessarily a necessary component, and may be deleted depending on a type of a thin film transistor 120 disposed on the flexible substrate 111. For example, the buffer layer may be formed of a plurality of inorganic layers alternately stacked. For example, the buffer layer may be composed of a multiple layer in which two or more inorganic layers of silicon oxide (SiOx) or silicon nitride (SiNx) are alternately stacked.

The thin film transistor 120 is disposed on the substrate 111, and may include a gate electrode 121, a source electrode 122, a drain electrode 123 and a semiconductor layer 124.

Here, the thin film transistor 120 illustrated in FIG. 5 may be a driving transistor connected to the light emitting element 130.

In FIG. 5, an upper gate (or top gate) structure in which the gate electrode 121 is positioned over the semiconductor layer 124 is illustrated, but embodiments are not limited thereto. That is, the thin film transistor 120 may have a lower gate (or bottom gate) structure in which the gate electrode 121 is positioned under the semiconductor layer 124, or a double gate structure in which the gate electrode 121 is positioned both over and under the semiconductor layer 124.

The semiconductor layer 124 may be disposed on the substrate 111 or the buffer layer.

A light blocking layer for blocking external light incident on the semiconductor layer 124 may be additionally disposed between the buffer layer and the semiconductor layer 124.

In this case, the semiconductor layer 124 may be composed of amorphous silicon or polycrystalline silicon, but is not limited thereto. Polycrystalline silicon has superior mobility than amorphous silicon and low energy power consumption and excellent reliability, and thus, may be applied to a driving thin film transistor within the pixel.

The semiconductor layer 124 may be formed of an oxide semiconductor.

The oxide semiconductor has excellent mobility and uniformity properties.

The semiconductor layer 124 may include a source region including a p-type or n-type impurity, a drain region, and a channel region between the source region and the drain region. A low concentration doped region may be further included between the source region and the drain region adjacent to the channel region.

The source region and the drain region are doped with a high concentration of impurity, and may be connected to the source electrode 122 and the drain electrode 123 of the thin film transistor 120, respectively.

As an impurity ion, the p-type impurity or n-type impurity may be used. The p-type impurity may be one of boron (B), aluminum (Al), gallium (Ga), and indium (In), and the n-type impurity may be one of phosphorus (P), arsenic (As), and antimony (Sb).

The channel region of the semiconductor layer 124 may be doped with the n-type impurity or p-type impurity according to an NMOS or PMOS thin film transistor structure, and the thin film transistor included in the foldable display device 100 according to the first embodiment of the present disclosure may be an NMOS or PMOS thin film transistor.

A first insulating layer 115a may be disposed to cover the semiconductor layer 124.

The first insulating layer 115a is an insulating layer composed of a single layer of silicon oxide (SiOx) or silicon nitride (SiNx) or multiple layers thereof, and may be disposed such that a current flowing through the semiconductor layer 124 does not flow to the gate electrode 121. In addition, silicon oxide is less ductile than metal, but is superior in ductility to silicon nitride, and may be formed as a single layer or multiple layers depending on characteristics thereof.

The gate electrode 121 serves as a switch for turning on or turning off the thin film transistor 120 based on an electric signal transmitted from the outside through the gate line, and may be composed of a single layer or multiple layers of a conductive metal such as copper (Cu), aluminum (Al), molybdenum (Mo), chromium (Cr), gold (Au), titanium (Ti), nickel (Ni), and neodymium (Nd), or alloys thereof. However, embodiments are not limited thereto.

The source electrode 122 and the drain electrode 123 are connected to the data line, and may enable an electric signal transmitted from the outside to be transmitted from the thin film transistor 120 to the light emitting element 130. The source electrode 122 and the drain electrode 123 may be composed of a single layer or multiple layers of a conductive metal such as copper (Cu), aluminum (Al), molybdenum (Mo), chromium (Cr), gold (Au), titanium (Ti), nickel (Ni), and neodymium (Nd), or alloys thereof, but are not limited thereto.

To insulate the gate electrode 121 and the source electrode 122 and the drain electrode 123 from each other, a second insulating layer 115b composed of a single layer or multiple layers of silicon oxide (SiOx) or silicon nitride (SiNx) may be disposed between the gate electrode 121 and the source electrode 122 and the drain electrode 123.

A passivation layer 115c formed of an inorganic insulating layer such as silicon oxide (SiOx) or silicon nitride (SiNx) may be disposed on the thin film transistor 120.

The passivation layer 115c may prevent unnecessary electrical connections between components disposed over and under the passivation layer 115c and prevent contamination or damage from the outside. The passivation layer 115c may be omitted depending on configurations and characteristics of the thin film transistor 120 and the light emitting element 130.

To protect the thin film transistor 120, alleviate a step caused by the thin film transistor 120, and reduce parasitic capacitance generated between the thin film transistor 120 and the gate line and the data line, and the light emitting elements 130, a planarization layer 115d may be disposed on the passivation layer 115c.

The planarization layer 115d may be formed of one or more of acrylic resin, epoxy resin, phenolic resin, polyamides resin, polyimide resin, unsaturated polyesters resin, polyphenylene resin, benzocyclobutene and polyphenylene sulfides resin, but is not limited thereto.

A buffer layer may be further disposed on the planarization layer 115d.

An intermediate electrode may be connected to the thin film transistor 120 through a contact hole formed in the planarization layer 115d. The intermediate electrode is stacked so as to be connected to the thin film transistor 120, and the data line may also be formed in a multilayer structure. However, embodiments of the present disclosure are not limited thereto, and the intermediate electrode may be omitted.

Meanwhile, a passivation layer formed of an inorganic insulating layer such as silicon oxide (SiOx) or silicon nitride (SiNx) may be further disposed on the planarization layer 115d. The passivation layer may serve to prevent unnecessary electrical connections between components and to prevent contamination or damage from the outside, and may be omitted depending on configurations and characteristics of the thin film transistor 120 and the light emitting element 130.

The light emitting element 130 disposed on the planarization layer 115d may include an anode 131, a light emitting unit 132, and a cathode 133.

The anode 131 may be disposed on the planarization layer 115d.

The anode 131 serves to supply holes to the light emitting unit 132 and is connected to an intermediate electrode through a contact hole in the planarization layer 115d to thereby be electrically connected to the thin film transistor 120.

The anode 131 may be formed of a transparent conductive material, such as indium tin oxide (ITO), indium zinc oxide (IZO), or the like, but is not limited thereto.

When the foldable display device 100 is a top emission type display device that emits light to an upper portion thereof where the cathode 133 is disposed, it may further include a reflective layer such that the emitted light is reflected from the anode 131 to be smoothly emitted in a direction toward the upper portion where the cathode 133 is disposed.

The anode 131 may be a two-layer structure in which a transparent conductive layer formed of a transparent conductive material and a reflective layer are sequentially stacked, or a three-layer structure in which a transparent conductive layer, a reflective layer and a transparent conductive layer are sequentially stacked. The reflective layer may be formed of silver (Ag) or an alloy including silver.

A bank 115e disposed on the anode 131 and the planarization layer 115d may define the sub-pixel by dividing areas that actually emits light. After forming a photoresist on the anode 131, the bank 115e may be formed by photolithography. Photoresist refers to a photosensitive resin whose solubility in a developer is changed by the action of light, and a specific pattern may be obtained by exposing and developing the photoresist. Types of photoresist may be classified into positive photoresist and negative photoresist. The positive photoresist refers to a photoresist whose solubility in a developer of an exposed portion is increased by exposure, and when the positive photoresist is developed, a pattern in which the exposed portion is removed is obtained. The negative photoresist refers to a photoresist whose solubility in a developer of the exposed portion is greatly reduced by exposure, and when the negative photoresist is developed, a pattern in which a non-exposed portion is removed is obtained.

A FMM (Fine Metal Mask) which is a deposition mask, may be used to form the light emitting unit 132 of the light emitting element 130.

In addition, to prevent damage that may occur due to contact with the deposition mask disposed on the bank 115e and to maintain a constant distance between the bank 115e and the deposition mask, a spacer formed of one of polyimide which is a transparent organic material, photo acryl, and benzocyclobutene (BCB) may be disposed on the bank 115e.

The light emitting unit 132 may be disposed between the anode 131 and the cathode 133.

The light emitting unit 132 serves to emit light and may include at least one of a hole injection layer (HIL), a hole transport layer (HTL), a light emitting layer, an electron transport layer (ETL), and an electron injection layer (EIL), and some components may be omitted depending on a structure or characteristics of the foldable display device 100. Here, an electroluminescent layer or an inorganic emitting layer may be applied to the light emitting layer.

The hole injection layer is disposed on the anode 131 to facilitate an injection of holes.

The hole transport layer is disposed on the hole injection layer to smoothly transport holes to the light emitting layer.

The light emitting layer is disposed on the hole transport layer and may include a material capable of emitting light of a specific color to thereby emit light of a specific color. In addition, a luminescent material may be formed using a phosphorescent material or a fluorescent material.

The electron injection layer may be further disposed on the electron transport layer. The electron injection layer is an organic layer that facilitates an injection of electrons from the cathode 133 and may be omitted depending on the structure and characteristics of the foldable display device 100.

On the other hand, at a position adjacent to the light emitting layer, an electron blocking layer or a hole blocking layer that blocks a flow of electrons or holes is further disposed to thereby prevent a phenomenon in which when electrons are injected into the light emitting layer, the electrons move from the light emitting layer and pass to the adjacent hole transport layer or a phenomenon in which when holes are injected into the light emitting layer, the holes move from the light emitting layer and pass to the adjacent electron transport layer, so that luminous efficiency may be improved.

The light emitting unit 132 according to the first embodiment of the present disclosure may include two or more light emitting units for emitting white light. For example, the light emitting unit 132 may include a first light emitting unit and a second light emitting unit for emitting white light by mixing first light and second light. Here, the first light emitting unit emits the first light and may include any one of a blue light emitting unit, a green light emitting unit, a red light emitting unit, a yellow light emitting unit, and a yellow green light emitting unit. The second light emitting unit may include a blue light emitting unit, a green light emitting unit, a red light emitting unit, a yellow light emitting unit, and a light emitting unit that emits light having a complementary color relation with the color of the first light among yellow-green colors.

The cathode 133 is disposed on the light emitting unit 132 and serves to supply electrons to the light emitting unit 132. Since the cathode 133 supplies electrons, it may be formed of a metal material such as magnesium (Mg), or silver-magnesium, which is a conductive material having a low work function, and is not limited thereto.

When the foldable display device 100 is a top emission type display device, the cathode 133 may be a transparent conductive oxide such as indium tin oxide (ITO), indium zinc oxide (IZO), indium tin zinc oxide (ITZO), zinc oxide (ZnO), and tin oxide (TO).

Meanwhile, pixels according to an example may be arranged in a stripe structure in the display area. In this case, one pixel may include a red sub-pixel, a green sub-pixel, and a blue sub-pixel, and may further include a white sub-pixel.

Pixels according to another example may be arranged in a pentile structure in the display area. In this case, one pixel may include one red sub-pixel, two green sub-pixels, and one blue sub-pixel that are arranged in a polygonal shape in a plane. For example, the pixel having a pentile structure may be arranged such that one red sub-pixel, two green sub-pixels, and one blue sub-pixel have an octagonal shape in a plane, and in this case, the blue sub-pixel may have the greatest size and the green sub-pixel may have the smallest size.

Meanwhile, an encapsulation unit may be disposed on the light emitting element 130 to prevent the thin film transistor 120 and the light emitting element 130, which are components of the foldable display device 100, from being oxidized or damaged due to moisture, oxygen, or impurities introduced from the outside. The encapsulation unit may be formed by stacking a plurality of encapsulation layers, a foreign material compensation layer, and a plurality of barrier films.

The encapsulation layer may be disposed on the entire surface of an upper portion of the thin film transistor 120 and the light emitting element 130, and may be formed of one of silicon nitride (SiNx) and aluminum oxide (AlyOz) which is an inorganic material. However, embodiments are not limited thereto. The foreign material compensation layer may be further disposed on the encapsulation layer.

The foreign material compensation layer is disposed on the encapsulation layer, and an organic material such as silicon oxycarbon (SiOCz), acrylic (acryl), or epoxy-based resin may be used for the foreign material compensation layer. However, embodiments are not limited thereto. When a defect occurs due to a crack generated by a foreign material or particles that may be generated during a process, it may be compensated for by covering a curve and a foreign material by the foreign material compensation layer.

The barrier film may be disposed on the encapsulation layer and the foreign material compensation layer, whereby the foldable display device 100 may delay the penetration of oxygen and moisture from the outside. The barrier film is configured in the form of a light-transmissive and double-sided adhesive film, and may be composed of any one of olefin-based, acrylic-based, and silicon-based insulating materials. Alternatively, a barrier film composed of any one of COP (cycloolefin polymer), COC (cycloolefin copolymer) and PC (Polycarbonate) may be further stacked, but is not limited thereto.

The touch panel 140 may be disposed on an upper portion of the encapsulation unit.

The first adhesive layer 161 may be disposed between the display panel 110 and the touch panel 140.

For example, the touch panel 140 may include a bridge electrode BE, a touch insulating layer 141, a first touch electrode TE1, and a second touch electrode TE2.

The touch insulating layer 141 may be disposed on the first adhesive layer 161.

For example, the touch insulating layer 141 may be formed of an inorganic layer, for example, a silicon oxide (SiOx) film, a silicon nitride (SiNx) film, or multiple layers thereof.

The bridge electrode BE may be disposed on the touch insulating layer 141.

The bridge electrode BE may be disposed in a bridge electrode area of the touch panel 140.

For example, the bridge electrode BE may have a single layer structure or a multilayer structure of a metal material. For example, the bridge electrode BE may have a single layer or multilayer structure formed of a metal material such as molybdenum (Mo), silver (Ag), titanium (Ti), copper (Cu), aluminum (Al) or the like. The bridge electrode BE may be disposed to overlap with the bank 115e so as to prevent a decrease in an opening area of the sub-pixel.

The interlayer insulating layer 142 may be disposed on the touch insulating layer 141 to surround the bridge electrode BE.

A bridge contact hole BCH may be formed in the interlayer insulating layer 142 which overlaps with both edges of the bridge electrode BE.

For example, the interlayer insulating layer 142 may be formed of any one organic material of polyacrylate resin, epoxy resin, phenolic resin, polyamide resin, polyimide resin, and benzocyclobutene resin.

The first touch electrode TE1 may be disposed on the interlayer insulating layer 142 that overlaps with the first touch electrode areas of the touch panel 140. Here, the first touch electrode areas are spaced apart from each other in a first direction. The first direction may be a direction parallel to a scan line or data line.

The second touch electrode TE2 may be disposed on the interlayer insulating layer 142 that overlaps with the second touch electrode areas of the touch panel 140. Here, the second touch electrode areas are spaced apart from each other in a second direction crossing the first direction.

The first and second touch electrodes TE1 and TE2 may be disposed in the same layer. The first and second touch electrodes TE1 and TE2 are spaced apart from each other with a sensing area therebetween, and may be electrically insulated from each other. The second touch electrodes TE2 spaced apart from each other in the second direction may be electrically connected to the bridge electrode BE through the bridge contact hole BCH formed in the interlayer insulating layer 142. Accordingly, the second touch electrodes TE2 spaced apart in the second direction are connected to each other through the bridge electrode BE, so that the first and second touch electrodes TE1 and TE2 in a cross area of the first and second touch electrodes TE1 and TE2 may be insulated from each other.

The first and second touch electrodes TE1 and TE2 according to the first embodiment of the present disclosure may include a mesh pattern in which metal lines having very small line widths cross each other. For example, the mesh pattern may have a single layer or multilayer structure formed of a metal material such as molybdenum (Mo), silver (Ag), titanium (Ti), copper (Cu), or aluminum (Al). The mesh pattern may be arranged to overlap with the bank 115e so as to prevent a reduction in the opening area of the sub-pixel. Each of the first touch electrode TE1 and the second touch electrode TE2 may have a mesh pattern structure, but an overall shape thereof may have a polygonal shape, for example, a rhombus shape. In this case, each of the first touch electrode TE1 and the second touch electrode TE2 arranged at an edge of the touch panel 140 may have a triangular shape. However, embodiments are not limited thereto, and the first and second touch electrodes TE1 and TE2 may have a line shape or a polygonal shape, for example, a rhombus shape.

An inorganic insulating layer 143 and a planarization layer 144 may be disposed to cover the first and second touch electrodes TE1 and TE2.

The inorganic insulating layer 143 may be formed of, for example, a silicon oxide (SiOx) film, a silicon nitride (SiNx) film, or multiple layers thereof.

The planarization layer 144 is formed to have a relatively large thickness so as to cover the first and second touch electrodes TE1 and TE2 and the inorganic insulating layer 143, thereby planarizing a step due to the electrodes of the touch panel 140. The planarization layer 144 may be formed of any one organic material of polyacrylate resin, epoxy resin, phenolic resin, polyamide resin, polyimide resin, and benzocyclobutene resin, but is not limited thereto.

The polarizing plate 165 may be disposed on the touch panel 140 configured as described above.

The second adhesive layer 162 may be disposed between the touch panel 140 and the polarizing plate 165.

The foldable display device according to the first embodiment of the present disclosure may further include the cover member 170.

The cover member 170 may be adhered to a front surface of the polarizing plate 165 with the third adhesive layer 163. For example, the cover member 170 may be formed of a plastic material, a metal material, or a glass material. In this case, the cover member 170 formed of a glass material may have any one of sapphire glass and gorilla glass or a structure in which these are bonded to each other. For example, the cover member 170 may be formed of gorilla glass having a relatively high durability.

The third adhesive layer 163 is to laminate the cover member 170 on the front surface of the polarizing plate 165 and includes, for example, a pressure sensitive adhesive, an optically clear adhesive, or an optically clear resin.

Meanwhile, in the foldable display device according to the first embodiment of the present disclosure, it is characterized in that photo acryl (PAC) which is an organic layer is used as the interlayer insulating layer 142 of the touch panel 140 to thereby reduce folding stress, and a crack stopper is applied to the edge of the touch panel 140, whereby the occurrence of cracks is suppressed even if a folding/unfolding operation of the foldable display device is repeated.

Hereinafter, the crack stopper at the edge of the touch panel 140 will be described in detail with reference to the drawings.

Figure 6A:
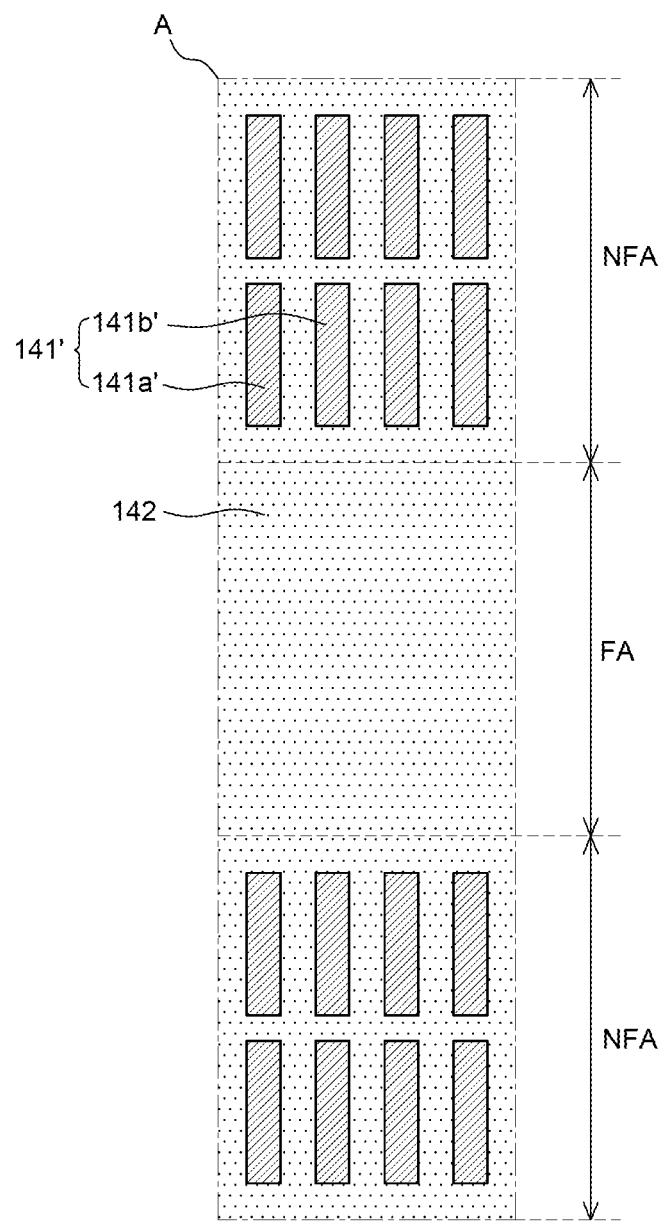
FIGS. 6A and 6B are enlarged views of portion A of FIG. 3.
Figure 6B:
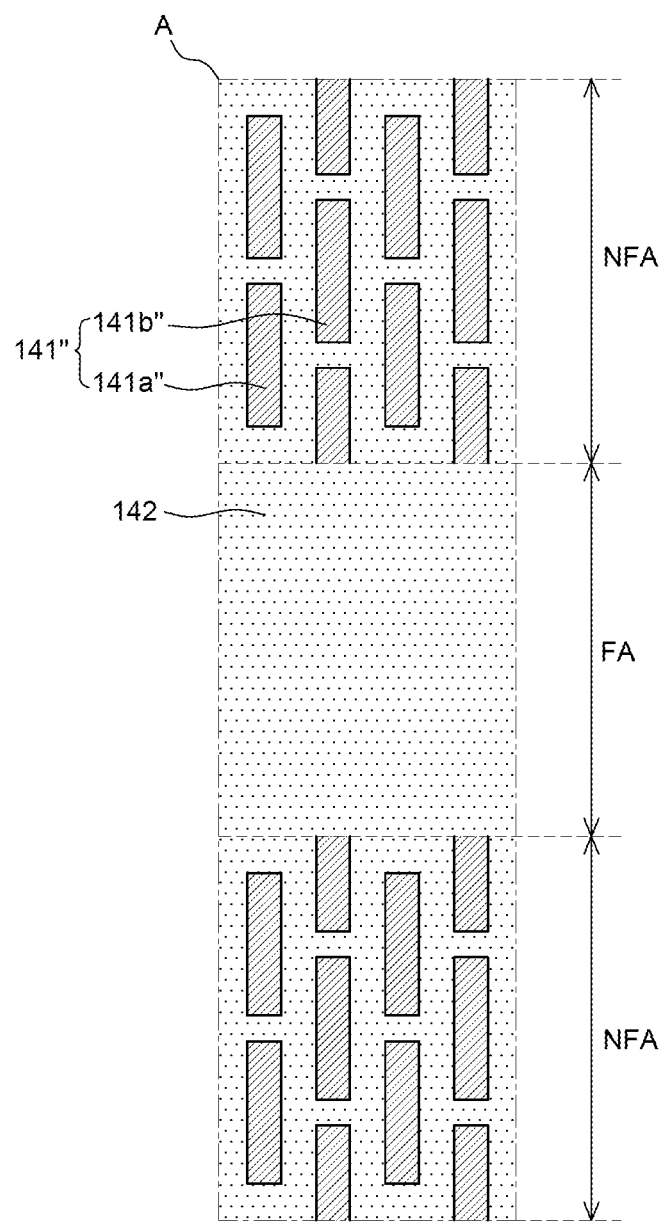

FIGS. 6A and 6B are enlarged views of portion A of FIG. 3.

Figure 7:
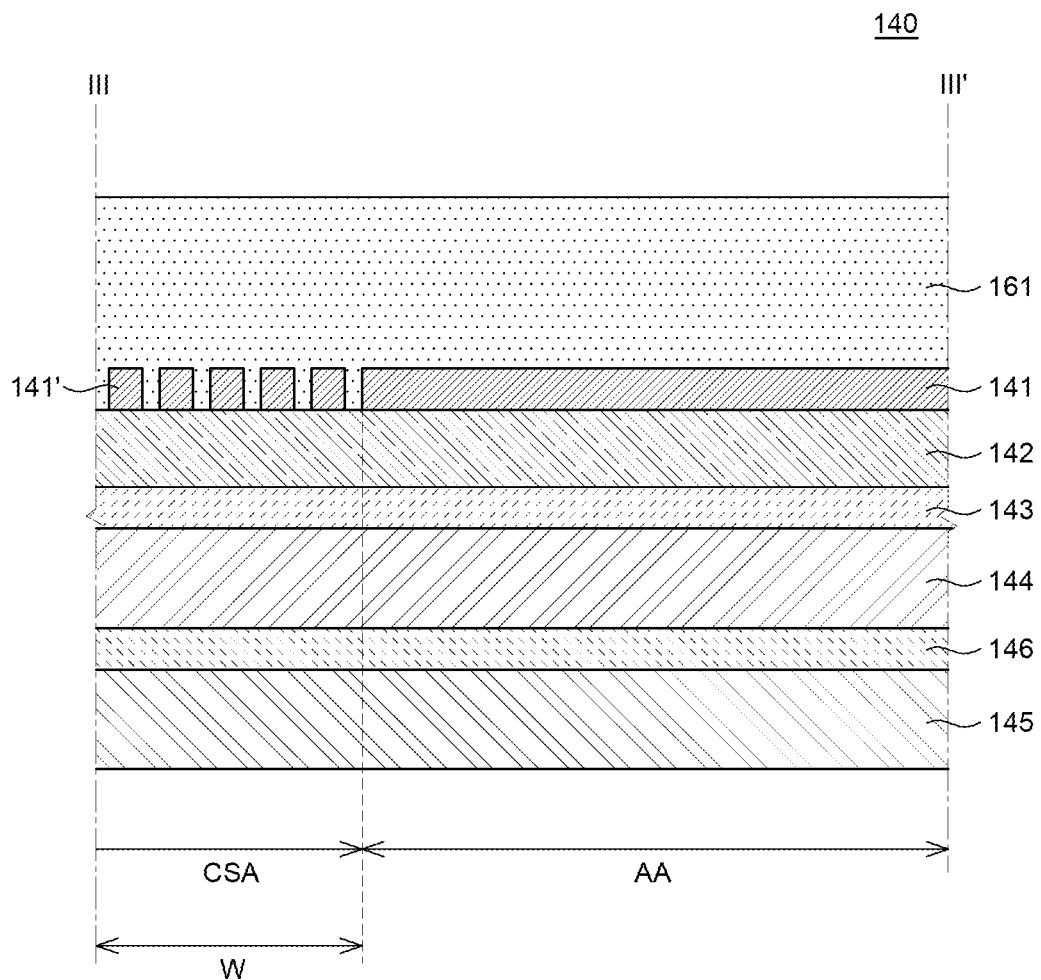
FIG. 7 is a cross-sectional view taken along line of FIG. 3.

FIG. 7 is a cross-sectional view taken along line of FIG. 3.

Figure 8:
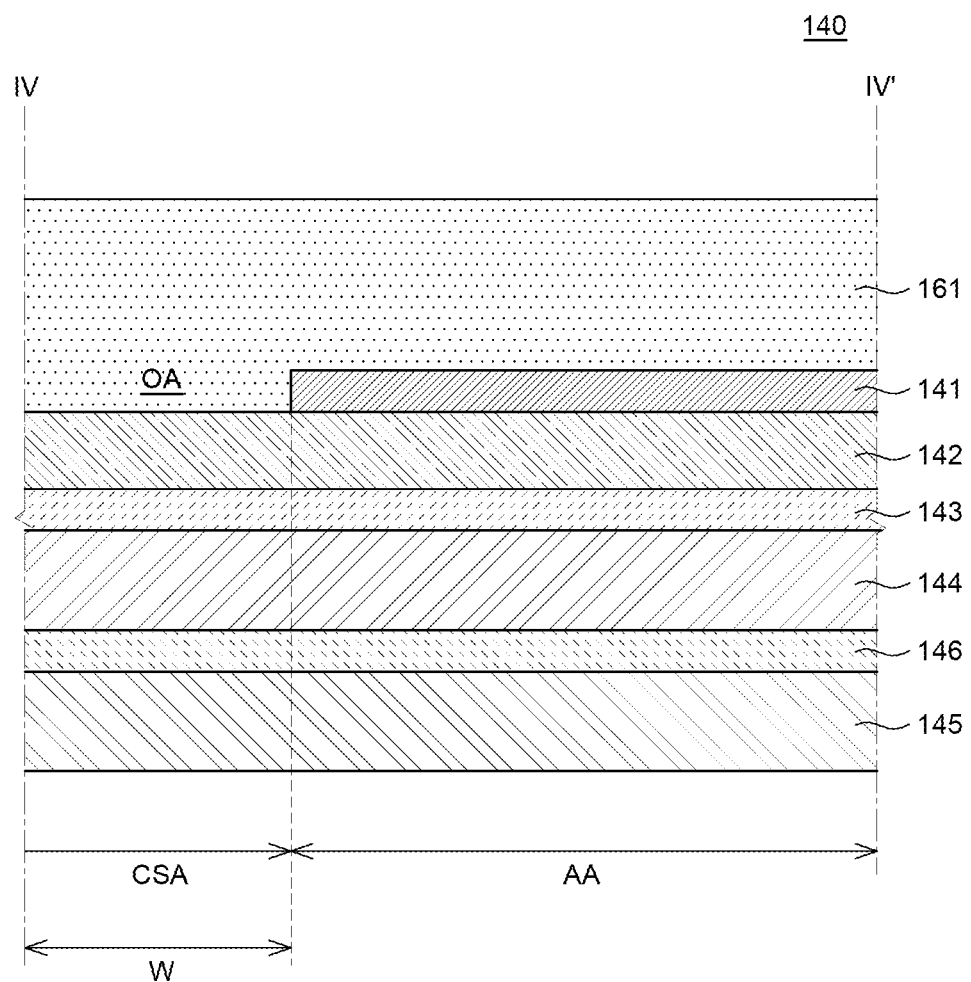
FIG. 8 is a cross-sectional view taken along line IV-IV' of FIG. 3.

FIG. 8 is a cross-sectional view taken along line IV-IV' of FIG. 3.

FIGS. 6A and 6B exemplify a crack stopper area of the non-display area.

FIG. 6A illustrates an example in which crack stoppers 141' are disposed in parallel, and FIG. 6B illustrates an example in which crack stoppers 141" are alternately disposed.

FIG. 7 illustrates a cross-sectional view of the touch panel 140 in the non-folding area as an example, and FIG. 8 illustrates a cross-sectional view of the touch panel 140 in the folding area as an example.

With reference to FIGS. 6A and 6B and FIGS. 7 and 8, the foldable display device according to the first embodiment of the present disclosure may include the display panel, the touch panel 140, the polarizing plate, and the cover member as described above.

In this case, the foldable display device according to the first embodiment of the present disclosure may be divided into the display area AA and the non-display area, and may also be divided into the folding area FA and the non-folding area NFA.

The display area AA is an area where an image is displayed, and a plurality of pixels including light emitting elements may be arranged in the display area AA. The light emitting element for displaying an image and a circuit unit for driving the light emitting element may be disposed in the display area AA.

The non-display area NA is an area where an image is not displayed. In the non-display area NA, circuits, wires, components, and the like for driving the light emitting elements of the display area AA are disposed.

The non-display area may include a crack stopper area CSA.

The non-display area is defined on a side surface of the foldable display device, and a portion of the non-display area may be configured to include the crack stopper area CSA.

The crack stopper area CSA may be disposed along the non-display area to have a constant width, and the width may be variously formed from several μm to hundreds of μm as needed.

The crack stopper area CSA means, for example, an area where the crack stoppers 141' and 141" for preventing cracks from propagating into the display area AA along a fracture surface when chamfering a partial area of the foldable display device are disposed.

Currently, a display panel constituting a foldable display device may be folded by including a substrate having flexibility. A display panel including a flexible substrate may be easily folded, but cracks may occur in an edge of the display panel when folding.

In particular, there is a problem that cracks and delamination occur between the touch insulating layer 141 and the interlayer insulating layer 142 of the touch panel 140 that is added to the display panel.

Accordingly, in the first embodiment of the present disclosure, it is characterized in that an organic layer of photo acryl is applied to the interlayer insulating layer 142 of the touch panel 140 to thereby reduce folding stress, and an open area OA is formed or the crack stoppers 141' and 141" are formed in the edge of the touch panel 140, that is, in the crack stopper area CSA, whereby the occurrence of cracks is suppressed even if a folding/unfolding operation of the foldable display device is repeated.

Meanwhile, the foldable display device may be defined as the display area AA and the non-display area, but may also be defined as the folding area FA and the non-folding area NFA.

The folding area (or the folding portion or the folding region) FA is an area where the display panel and the touch panel 140 are folded when the foldable display device is folded, and includes a portion of the display area AA and a portion of the non-display area.

The folding area FA may be folded along a specific radius of curvature with respect to a folding axis.

Also, the non-folding area (or a non-folding portion or non-folding region) NFA is an area where the display panel and the touch panel 140 are not folded when the foldable display device is folded. The non-folding area NFA may include a portion of the display area AA and a portion of the non-display area NA.

The touch panel 140 may be disposed on the display panel. Although not illustrated, the display panel is disposed above the touch panel 140 in FIGS. 7 and 8, but for convenience, the touch panel 140 is described as being disposed above the display panel based on the arrangement of FIGS. 4 and 5. Therefore, in FIGS. 7 and 8, the touch panel 140 is disposed above the display panel, and a substrate 145 is positioned on a top portion of the touch panel 140 and the touch insulating layer 141 is positioned on a bottom portion of the touch panel 140.

For example, the touch panel 140 may include a bridge electrode, the touch insulating layer 141, a first touch electrode, and a second touch electrode.

The touch insulating layer 141 may be disposed on the display panel with the first adhesive layer 161 interposed therebetween.

For example, the touch insulating layer 141 may be formed of an inorganic layer, for example, a silicon oxide (SiOx) film, a silicon nitride (SiNx) film, or multiple layers thereof.

The bridge electrode may be disposed on the touch insulating layer 141.

The bridge electrode may be disposed in a bridge electrode area of the touch panel 140.

For example, the bridge electrode may have a single layer structure or a multilayer structure of a metal material. For example, the bridge electrode may have a single layer or multilayer structure formed of a metal material such as molybdenum (Mo), silver (Ag), titanium (Ti), copper (Cu), aluminum (Al) or the like. The bridge electrode may be disposed to overlap with the bank so as to prevent a decrease in an open area of the sub-pixel.

The interlayer insulating layer 142 may be disposed on the touch insulating layer 141 to surround the bridge electrode.

For example, the interlayer insulating layer 142 may be formed of any one organic material of polyacrylate resin, epoxy resin, phenolic resin, polyamide resin, polyimide resin, and benzocyclobutene resin.

The first touch electrode may be disposed on the interlayer insulating layer 142 that overlaps with the first touch electrode areas of the touch panel 140. Here, the first touch electrode areas are spaced apart from each other in a first direction. The first direction may be a direction parallel to a scan line or data line.

The second touch electrode may be disposed on the interlayer insulating layer 142 that overlaps with the second touch electrode areas of the touch panel 140. Here, the second touch electrode areas are spaced apart from each other in a second direction crossing the first direction.

The first and second touch electrodes may be disposed in the same layer. The first and second touch electrodes are spaced apart from each other with a sensing area therebetween, and may be electrically insulated from each other. The second touch electrodes spaced apart from each other in the second direction may be electrically connected to the bridge electrode through a bridge contact hole formed in the interlayer insulating layer 142. Accordingly, the second touch electrodes spaced apart in the second direction are connected to each other through the bridge electrode, so that the first and second touch electrodes in a cross area of the first and second touch electrodes may be insulated from each other.

The first and second touch electrodes according to the first embodiment of the present disclosure may include a mesh pattern in which metal lines having very small line widths cross each other. For example, the mesh pattern may have a single layer or multilayer structure formed of a metal material such as molybdenum (Mo), silver (Ag), titanium (Ti), copper (Cu), or aluminum (Al). The mesh pattern may be arranged to overlap with the bank so as to prevent a reduction in the opening area of the sub-pixel. Each of the first touch electrode and the second touch electrode may have a mesh pattern structure, but an overall shape thereof may have a polygonal shape, for example, a rhombus shape. In this case, each of the first touch electrode and the second touch electrode arranged at an edge of the touch panel 140 may have a triangular shape. However, embodiments are not limited thereto, and the first and second touch electrodes may have a line shape or a polygonal shape, for example, a rhombus shape.

The inorganic insulating layer 143 and the planarization layer 144 may be disposed to cover the first and second touch electrodes.

The inorganic insulating layer 143 may be formed of, for example, a silicon oxide (SiOx) film, a silicon nitride (SiNx) film, or multiple layers thereof.

The planarization layer 144 is formed to have a relatively large thickness so as to cover the first and second touch electrodes and the inorganic insulating layer 143, thereby planarizing a step due to the electrodes of the touch panel 140. The planarization layer 144 may be formed of any one organic material of polyacrylate resin, epoxy resin, phenolic resin, polyamide resin, polyimide resin, and benzocyclobutene resin, but is not limited thereto.

In addition, the substrate 145 may be attached onto the planarization layer 144 with a sacrificial layer 146 interposed therebetween, and the substrate 145 may be released (or removed) after a process is completed.

Meanwhile, with reference to FIGS. 6A, 6B, and 7, in the crack stopper area CSA of the non-folding area NFA of the touch panel 140 according to the first embodiment of the present disclosure, the crack stoppers 141' and 141" for preventing cracks from propagating into the display area may be disposed.

The crack stoppers 141' and 141" may be formed to have a predetermined width and length by selectively patterning the touch insulating layer 141.

The crack stoppers 141' and 141" may be disposed in parallel in a direction perpendicular to a direction in which cracks propagate, for example, in a direction toward the display area from the crack stopper area CSA. The crack stoppers 141' and 141" may have a bar shape. In some embodiments, the cross-sections of the crack stoppers 141' and 141" may have a bar shape. FIGS. 6A and 6B illustrate an example in which the plurality of crack stoppers 141' and 141" have several separate bar shapes, but embodiments are not limited thereto. The plurality of crack stoppers 141' and 141" may have a single bar shape. In addition, the crack stoppers 141' and 141" may have various shapes such as a square shape or an oval shape, in addition to the bar shape. Further, in some embodiments, the cross-sections of the plurality of crack stoppers 141' and 141" may include a single bar shape, a square shape, or an oval shape, or the like.

For example, the crack stoppers 141' and 141" may be configured such that the first crack stoppers 141*a*' and 141*a*" and the second crack stoppers 141*b*' and 141*b*" are parallel to each other. The first crack stoppers 141*a*' and 141*a*" and the second crack stoppers 141*b*' and 141*b*" may have a bar shape and may be alternately disposed. In this case, with reference to FIG. 6A, the first crack stopper 141*a*' and the second crack stopper 141*b*' may be arranged in parallel to each other. With reference to FIG. 6B, the first crack stopper 141*a*" and the second crack stopper 141*b*" may be alternately disposed.

As shown in FIG. 6B, when the first crack stopper 141a" and the second crack stopper 141b" are alternately disposed, for example, even if cracks propagate through the first crack stopper 141a", the propagation of cracks may be blocked by the second crack stopper 141b" disposed alternately with the first crack stopper 141a".

With reference to FIGS. 6A and 6B and FIG. 8, in the crack stopper area CSA of the folding area of the touch panel 140 according to the first embodiment of the present disclosure, an open area OA for preventing cracks from propagating into the display area may be disposed.

The open area OA may be formed to expose the interlayer insulating layer 142 by at least partially or entirely removing the touch insulating layer 141 from the crack stopper area CSA.

For example, the open area OA may be formed in a strip shape having a predetermined width along a chamfered portion. However, embodiments are not limited thereto.

The open area OA prevents the occurrence of cracks at a boundary between the touch insulating layer 141 and the interlayer insulating layer 142 and blocks cracks from penetrating into the display area. That is, by forming the open area OA to remove a part of the touch insulating layer 141, a medium through which cracks propagate is removed to thereby stop the propagation of cracks.

A portion of the crack stopper area CSA, from which the touch insulating layer 141 is removed, may be filled with the first adhesive layer 161 which is an organic material, whereby the prevention of cracks may be facilitated and stress may be reduced or minimized. Thus, it is feasible to block the growth of cracks into the display area.

That is, a defect that occurs frequently in the foldable display device is, for example, a crack defect, and particularly, it occurs in the edge of the touch panel 140. To improve such an edge crack, photo acryl (PAC) which is an organic layer is applied to the interlayer insulating layer 142 of the touch panel 140 to thereby reduce folding stress. However, materials other than photo acryl (PAC) may be used, and a person of ordinary skill in the art would readily appreciate that various materials that suits the above purpose may be utilized.

In addition, in non-display area of the touch panel 140, the crack stopper area CSA is divided and formed in the folding area FA and the non-folding area NFA. The crack stoppers 141' and 141" are formed in the crack stopper area CSA of the non-folding area NFA of the touch panel 140. In addition, in the folding area FA, the open area OA is formed by removing the touch insulating layer 141, so that crack propagation may be effectively blocked.

Meanwhile, to effectively prevent crack propagation, a width W of the crack stopper area CSA (as shown in FIGS. 7 and 8) may be widened, and depths of the crack stoppers 141' and 141" and the open area OA may increase.

For example, the crack stopper area CSA may have a width W of 45 μm to 100 μm.

In addition, the crack stoppers 141' and 141" and the open area OA may not only be applied to the touch insulating layer 141, but may also be applied to the interlayer insulating layer 142, the inorganic insulating layer 143, and the planarization layer 144. This will be described in detail through the second and third embodiments of the present disclosure.

Figure 9:
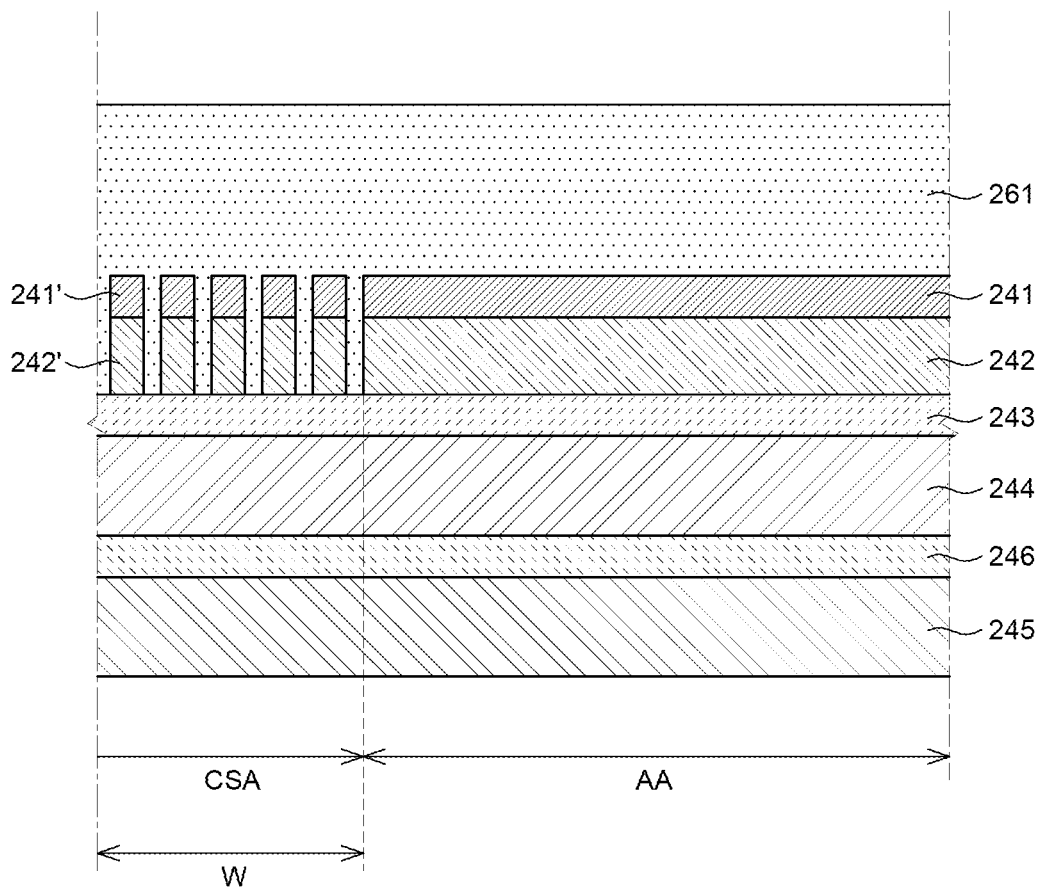
FIG. 9 is a cross-sectional view of a non-folding area of a touch panel according to a second embodiment of the present disclosure.

FIG. 9 is a cross-sectional view of a non-folding area of a touch panel according to a second embodiment of the present disclosure.

Figure 10:
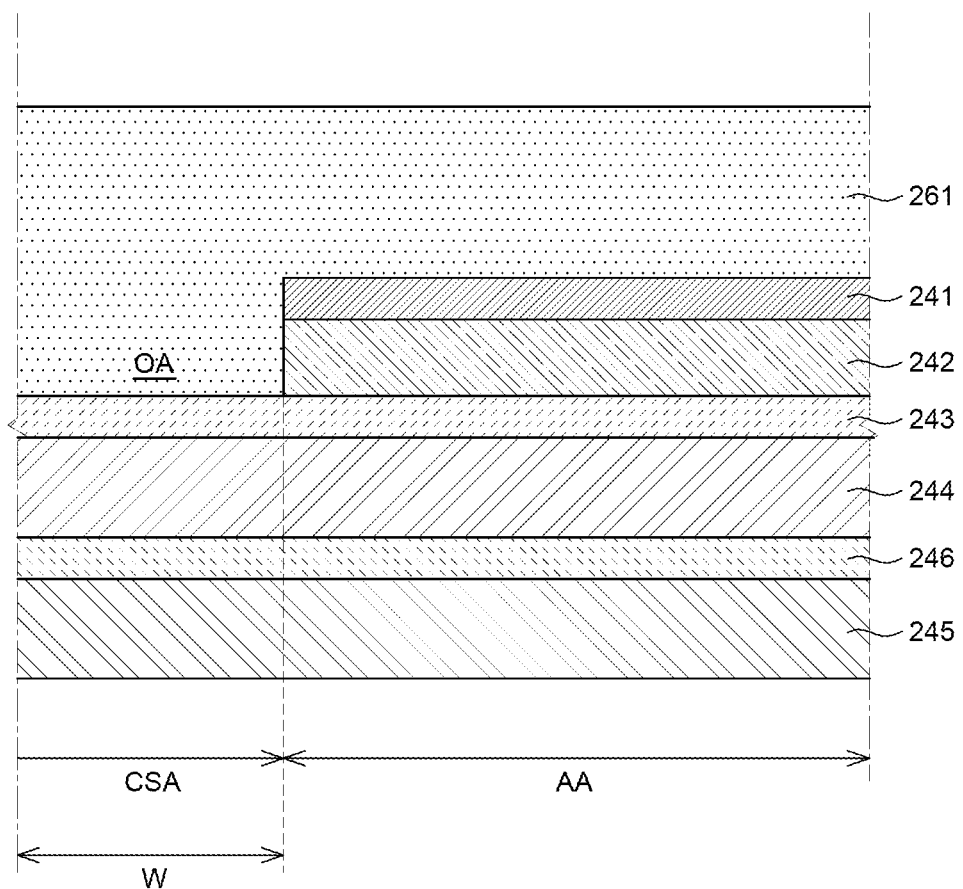
FIG. 10 is a cross-sectional view of a folding area of the touch panel according to the second embodiment of the present disclosure.

FIG. 10 is a cross-sectional view of a folding area of the touch panel according to the second embodiment of the present disclosure.

FIG. 9 illustrates a cross-sectional view of a touch panel 240 in the non-folding area as an example, and FIG. 10 illustrates a cross-sectional view of the touch panel 240 in the folding area as an example.

A foldable display device according to the second embodiment of the present disclosure illustrated in FIGS. 9 and 10 is formed to have substantially the same configurations as the foldable display device of the first embodiment described above, except for a configuration of the touch panel 240. Therefore, a description of the same configurations will be omitted.

With reference to FIGS. 9 and 10, the foldable display device according to the second embodiment of the present disclosure may include the display panel, the touch panel 240, the polarizing plate, and the cover member as described above.

In this case, the foldable display device according to the second embodiment of the present disclosure may be divided into a display area AA and a non-display area, and may also be divided into a folding area FA and a non-folding area NFA.

The non-display area may include a crack stopper area CSA.

That is, the non-display area is defined on a side surface of the foldable display device, and a portion of the non-display area may be configured to include the crack stopper area CSA.

The crack stopper area CSA may be disposed along the non-display area to have a constant width, and the width may be variously formed from several μm to hundreds of μm as needed.

In the crack stopper area CSA, for example, crack stoppers 241' and 242' and an open area OA for preventing cracks generated during trimming or folding from propagating into the display area AA may be disposed.

That is, in the second embodiment of the present disclosure, it is characterized in that an organic layer of photo acryl is applied to an interlayer insulating layer 242 of the touch panel 240 to thereby folding stress, and the crack stoppers 241' and 242' and the open area OA are formed in an edge of the touch panel 240, that is, in the crack stopper area CSA, whereby crack occurrence and crack propagation are suppressed even if a folding/unfolding operation of the foldable display device is repeated.

With reference to FIGS. 9 and 10, the touch panel 240 may be disposed on the display panel.

For example, the touch panel 240 may include a bridge electrode, a touch insulating layer 241, a first touch electrode, and a second touch electrode.

The touch insulating layer 241 may be disposed on the display panel with a first adhesive layer 261 interposed therebetween.

For example, the touch insulating layer 241 may be formed of an inorganic layer, for example, a silicon oxide (SiOx) film, a silicon nitride (SiNx) film, or multiple layers thereof.

The bridge electrode may be disposed on the touch insulating layer 241.

The bridge electrode may be disposed in a bridge electrode area of the touch panel 240.

For example, the bridge electrode may have a single layer structure or a multilayer structure of a metal material. For example, the bridge electrode may have a single layer or multilayer structure formed of a metal material such as molybdenum (Mo), silver (Ag), titanium (Ti), copper (Cu), aluminum (Al) or the like. The bridge electrode may be disposed to overlap with a bank so as to prevent a decrease in an open area of a sub-pixel.

The interlayer insulating layer 242 may be disposed on the touch insulating layer 241 to surround the bridge electrode.

For example, the interlayer insulating layer 242 may be formed of any one organic material of polyacrylate resin, epoxy resin, phenolic resin, polyamide resin, polyimide resin, and benzocyclobutene resin.

The first touch electrode may be disposed on the interlayer insulating layer 242 that overlaps with the first touch electrode areas of the touch panel 240. Here, the first touch electrode areas are spaced apart from each other in a first direction. The first direction may be a direction parallel to a scan line or data line.

The second touch electrode may be disposed on the interlayer insulating layer 242 that overlaps with the second touch electrode areas of the touch panel 240. Here, the second touch electrode areas are spaced apart from each other in a second direction crossing the first direction.

The first and second touch electrodes may be disposed in the same layer. The first and second touch electrodes are spaced apart from each other with a sensing area therebetween, and may be electrically insulated from each other. The second touch electrodes spaced apart from each other in the second direction may be electrically connected to the bridge electrode through a bridge contact hole formed in the interlayer insulating layer 242. Accordingly, the second touch electrodes spaced apart in the second direction are connected to each other through the bridge electrode, so that the first and second touch electrodes in a cross area of the first and second touch electrodes may be insulated from each other.

The first and second touch electrodes according to the second embodiment of the present disclosure may include a mesh pattern in which metal lines having very small line widths cross each other. For example, the mesh pattern may have a single layer or multilayer structure formed of a metal material such as molybdenum (Mo), silver (Ag), titanium (Ti), copper (Cu), or aluminum (Al). The mesh pattern may be arranged to overlap with the bank so as to prevent a reduction in the opening area of the sub-pixel. Each of the first touch electrode and the second touch electrode may have a mesh pattern structure, but an overall shape thereof may have a polygonal shape, for example, a rhombus shape. In this case, each of the first touch electrode and the second touch electrode arranged at an edge of the touch panel 240 may have a triangular shape. However, embodiments are not limited thereto, and the first and second touch electrodes may have a line shape or a polygonal shape, for example, a rhombus shape.

An inorganic insulating layer 243 and a planarization layer 244 may be disposed to cover the first and second touch electrodes.

The inorganic insulating layer 243 may be formed of, for example, a silicon oxide (SiOx) film, a silicon nitride (SiNx) film, or multiple layers thereof.

The planarization layer 244 is formed to have a relatively large thickness so as to cover the first and second touch electrodes and the inorganic insulating layer 243, thereby planarizing a step due to the electrodes of the touch panel 240. The planarization layer 244 may be formed of any one organic material of polyacrylate resin, epoxy resin, phenolic resin, polyamide resin, polyimide resin, and benzocyclobutene resin, but is not limited thereto.

In addition, a substrate 245 may be attached to the planarization layer 244 with a sacrificial layer 246 interposed therebetween, and the substrate 245 may be released (or removed) after a process is completed.

Meanwhile, in the crack stopper area CSA of the non-folding area NFA of the touch panel 240 according to the second embodiment of the present disclosure, the crack stoppers 241' and 242' for preventing cracks from propagating into the display area may be disposed.

The crack stoppers 241' and 242' according to the second embodiment of the present disclosure may be formed to have a predetermined width and length by selectively patterning the touch insulating layer 241 and the interlayer insulating layer 242.

The crack stoppers 241' and 242' may be disposed in parallel in a direction perpendicular to a direction in which cracks propagate, for example, in a direction toward the display area from the crack stopper area CSA. The crack stoppers 241' and 242' may have a bar shape. The plurality of crack stoppers 241' and 242' may have several separate bar shapes, but embodiments are not limited thereto. The plurality of crack stoppers 241' and 242' may have a single bar shape. In addition, the crack stoppers 241' and 242' may have various shapes such as a square shape or an oval shape, in addition to the bar shape.

For example, the crack stoppers 241' and 242' may configured such that first crack stoppers and second crack stoppers that are in parallel and have a bar shape are alternately disposed. The first crack stopper and the second crack stopper may be disposed in parallel to each other. The crack stopper and the second crack stopper may be staggeredly disposed.

In the crack stopper area CSA of the folding area of the touch panel 240 according to the second embodiment of the present disclosure, an open area OA for preventing cracks from propagating into the display area may be disposed.

The open area OA may be formed to expose the inorganic insulating layer 243 by completely removing the touch insulating layer 241 and the interlayer insulating layer 242 from the crack stopper area CSA.

For example, the open area OA may be formed in a strip shape having a predetermined width along a chamfered portion. However, embodiments are not limited thereto.

A portion of the crack stopper area CSA, from which the touch insulating layer 241 and the interlayer insulating layer 242 are removed, may be filled with a first adhesive layer 261 which is an organic material.

Meanwhile, to effectively prevent crack propagation, a width W of the crack stopper area CSA (as shown in FIGS. 9 and 10) may be widened, and depths of the crack stoppers 241' and 242' and the open area OA may increase.

For example, the crack stopper area CSA may have a width W of 45 μm to 100 μm.

Figure 11:
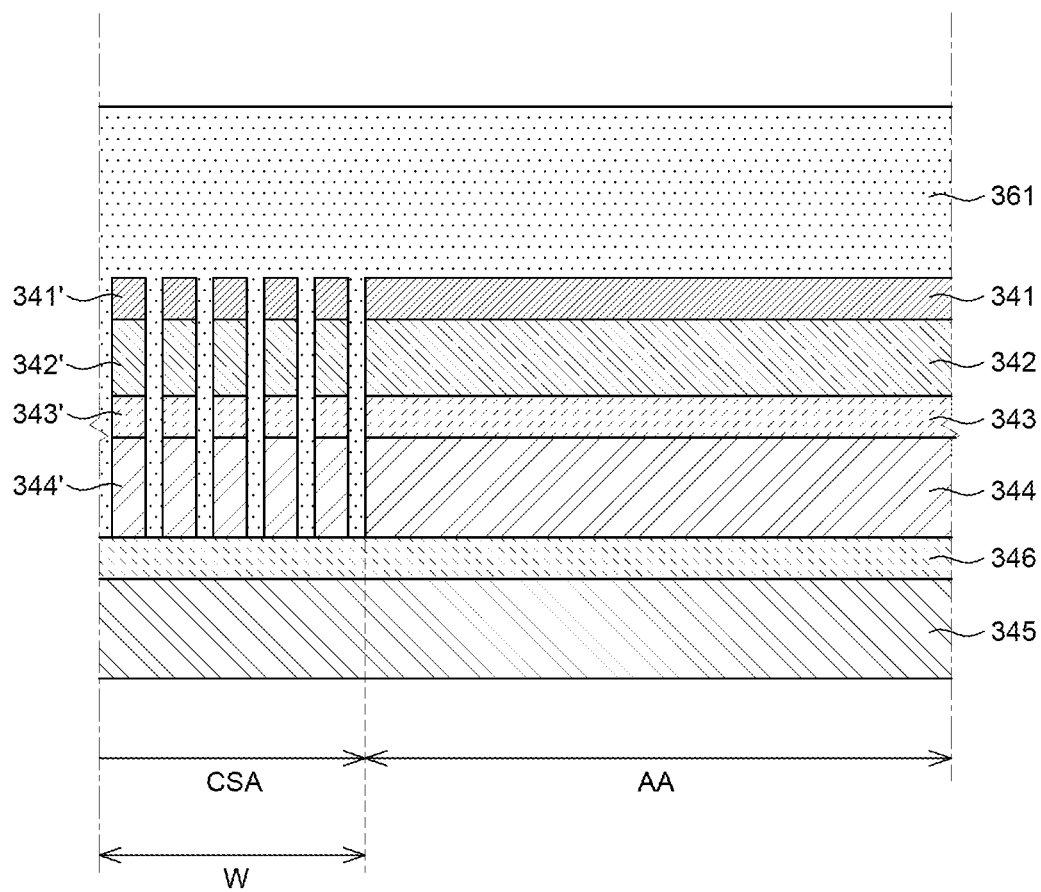
FIG. 11 is a cross-sectional view of a non-folding area of a touch panel according to a third embodiment of the present disclosure.

FIG. 11 is a cross-sectional view of a non-folding area of a touch panel according to a third embodiment of the present disclosure.

Figure 12:
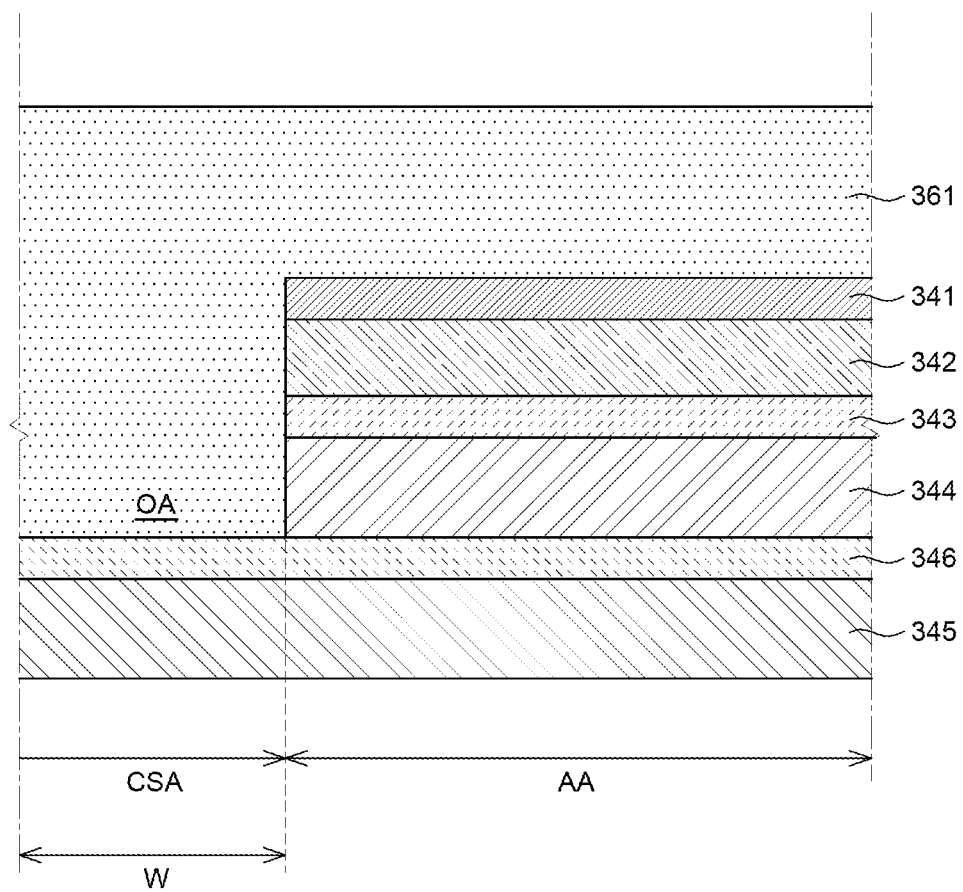
FIG. 12 is a cross-sectional view of a folding area of the touch panel according to the third embodiment of the present disclosure.

FIG. 12 is a cross-sectional view of a folding area of the touch panel according to the third embodiment of the present disclosure.

FIG. 11 shows a cross-sectional view of a touch panel 340 in the non-folding area as an example, and FIG. 12 shows a cross-sectional view of the touch panel 340 in the folding area as an example.

A foldable display device according to the third embodiment of the present disclosure illustrated in FIGS. 11 and 12 is formed to have substantially the same configurations as the foldable display devices of the first and second embodiments described above, except for a configuration of the touch panel 340. Therefore, a description of the same configurations will be omitted.

With reference to FIGS. 11 and 12, the foldable display device according to the third embodiment of the present disclosure may include the display panel, the touch panel 340, the polarizing plate, and the cover member as described above.

In this case, the foldable display device according to the third embodiment of the present disclosure may be divided into a display area AA and a non-display area NA, and may also be divided into a folding area FA and a non-folding area NFA.

The non-display area NA may include a crack stopper area CSA.

That is, the non-display area NA is defined on a side surface of the foldable display device, and a portion of the non-display area NA may be configured to include the crack stopper area CSA.

The crack stopper area CSA may have a constant width along the non-display area, and the width may be variously formed from several μm to hundreds of μm as needed.

In the crack stopper area CSA, for example, crack stoppers 341', 342', 343', and 344' and an open area OA for preventing cracks generated during trimming or folding from propagating into the display area AA may be disposed.

In the third embodiment of the present disclosure, it is characterized in that an organic layer of photo acryl is applied to an interlayer insulating layer 342 of the touch panel 340 to thereby folding stress, and the crack stoppers 341', 342', 343', and 344' and the open area OA are formed in the crack stopper area CSA of the touch panel 340, whereby crack occurrence and crack propagation are suppressed even if a folding/unfolding operation of the foldable display device is repeated.

With reference to FIGS. 11 and 12, the touch panel 340 may be disposed on the display panel.

For example, the touch panel 340 may include a bridge electrode, a touch insulating layer 341, a first touch electrode, and a second touch electrode.

The touch insulating layer 341 may be disposed on the display panel with a first adhesive layer 361 interposed therebetween.

For example, the touch insulating layer 341 may be formed of an inorganic layer, for example, a silicon oxide (SiOx) film, a silicon nitride (SiNx) film, or multiple layers thereof.

The bridge electrode may be disposed on the touch insulating layer 341.

The interlayer insulating layer 342 may be disposed on the touch insulating layer 341 to surround the bridge electrode.

For example, the interlayer insulating layer 342 may be formed of any one organic material of polyacrylate resin, epoxy resin, phenolic resin, polyamide resin, polyimide resin, and benzocyclobutene resin.

The first touch electrode may be disposed on the interlayer insulating layer 342 that overlaps with a first touch electrode area of the touch panel 340.

The second touch electrode may be disposed on the interlayer insulating layer 342 that overlaps with a second touch electrode area of the touch panel 340.

An inorganic insulating layer 343 and a planarization layer 344 may be disposed to cover the first and second touch electrodes.

The inorganic insulating layer 343 may be formed of, for example, a silicon oxide (SiOx) film, a silicon nitride (SiNx) film, or multiple layers thereof.

The planarization layer 344 is formed to have a relatively large thickness so as to cover the first and second touch electrodes and the inorganic insulating layer 343, thereby planarizing a step due to the electrodes of the touch panel 340. The planarization layer 344 may be formed of any one organic material of polyacrylate resin, epoxy resin, phenolic resin, polyamide resin, polyimide resin, and benzocyclobutene resin, but is not limited thereto.

In addition, a substrate 345 may be attached to the planarization layer 344 with a sacrificial layer 346 interposed therebetween, and the substrate 345 may be released (or removed) after a process is completed.

Meanwhile, in the crack stopper area CSA of the non-folding area NFA of the touch panel 340 according to the third embodiment of the present disclosure, the crack stoppers 341', 342', 343', and 344' for preventing cracks from propagating into the display area may be disposed.

The crack stoppers 341', 342', 343', and 344' according to the third embodiment of the present disclosure may be formed to have a predetermined width and length by selectively patterning the touch insulating layer 341, the interlayer insulating layer 342, the inorganic insulating layer 343 and the planarization layer 344.

The crack stoppers 341', 342', 343', and 344' may be disposed in parallel in a direction perpendicular to a direction in which cracks propagate, for example, in a direction toward the display area from the crack stopper area CSA. The crack stoppers 341', 342', 343', and 344' may have a bar shape. The plurality of crack stoppers 341', 342', 343', and 344' may have separate bar shapes, but embodiments are not limited thereto. The plurality of crack stoppers 341', 342', 343', and 344' may have a single bar shape. In addition, the crack stoppers 341', 342', 343', and 344' may have various shapes such as a square shape or an oval shape, in addition to the bar shape.

For example, the crack stoppers 341', 342', 343', and 344' may configured such that first crack stoppers and second crack stoppers that are in parallel and have a bar shape are alternately disposed. The first crack stopper and the second crack stopper may be arranged in parallel to each other. The crack stopper and the second crack stopper may be staggeredly disposed.

In the crack stopper area CSA of the folding area of the touch panel 340 according to the third embodiment of the present disclosure, an open area OA for preventing cracks from propagating into the display area may be disposed.

In this case, the open area OA may be formed to expose the sacrificial layer 346 by completely removing the touch insulating layer 341, the interlayer insulating layer 342, the inorganic insulating layer 343 and the planarization layer 344 from the crack stopper area CSA.

For example, the open area OA may be formed in a strip shape having a predetermined width along a chamfered portion. However, embodiments are not limited thereto.

In this case, a portion of the crack stopper area CSA, from which the touch insulating layer 341, the interlayer insulating layer 342, the inorganic insulating layer 343 and the planarization layer 344 are removed, may be filled with the first adhesive layer 361 which is an organic material.

Meanwhile, to effectively prevent crack propagation, a width W of the crack stopper area CSA (as shown in FIGS. 11 and 12) may be widened, and depths of the crack stoppers 341', 342', 343', and 344' and the open area OA may increase.

For example, the crack stopper area CSA may have a width W of 45 μm to 100 μm.

The embodiments of the present disclosure can also be described as follows:

According to an aspect of the present disclosure, there is provided a foldable display device. The foldable display device includes a display panel divided into a folding area and a non-folding area, and divided into a display area and a non-display area, a touch panel disposed on the display panel and including a bridge electrode, a plurality of insulating layers, a first touch electrode, and a second touch electrode, a plurality of crack stoppers disposed in the non-display area of the touch panel and configured by patterning the insulating layers and an adhesive layer filling a space between the plurality of crack stoppers from which the insulating layers are removed, the adhesive layer being disposed between the display panel and the touch panel.

The plurality of insulating layers may include a touch insulating layer, an interlayer insulating layer on the bridge electrode, an inorganic insulating layer on the first touch electrode and the second touch electrode and a planarization layer on the inorganic insulating layer.

The interlayer insulating layer may be made of an organic layer.

The non-display area may include a crack stopper area, wherein the crack stoppers may be disposed in the crack stopper area of the non-folding area.

The crack stoppers may be configured by patterning the touch insulating layer.

The crack stoppers may be configured by patterning the touch insulating layer and the interlayer insulating layer.

The crack stoppers may be configured by patterning the touch insulating layer, the interlayer insulating layer, the inorganic insulating layer, and the planarization layer.

The crack stoppers may be disposed to be parallel in a direction perpendicular to a direction toward the display area from the crack stopper area.

The crack stoppers may have a bar shape, a square shape, or an ellipse shape.

The plurality of crack stoppers may have several separate bar shapes.

The plurality of crack stoppers may have a single bar shape.

The plurality of crack stoppers may be configured such that a first crack stopper and a second crack stopper that are in parallel and have a bar shape are alternately disposed.

The first crack stopper and the second crack stopper may be disposed in parallel to each other.

The first crack stopper and the second crack stopper may be alternately disposed.

The foldable display device may further include an open area exposing another insulating layer by entirely removing at least one insulating layer of the plurality of insulating layers, wherein the adhesive layer may fill the open area.

The open area may be disposed in the crack stopper area of the folding area.

The open area may expose a surface of the interlayer insulating layer by entirely removing the touch insulating layer.

The open area may expose a surface of the inorganic insulating layer by entirely removing the touch insulating layer and the interlayer insulating layer.

The open area may be an area in which the touch insulating layer, the interlayer insulating layer, the inorganic insulating layer, and the planarization layer are entirely removed.

According to another aspect of the present disclosure, there is provided a foldable display device. The foldable display device includes a display panel divided into a folding area and a non-folding area, and divided into a display area and a non-display area, a touch panel disposed on the display panel and including a plurality of insulating layers, a plurality of crack stoppers disposed in the non-folding area of the non-display area of the touch panel, and configured by patterning the insulating layers, an open area disposed in the folding area of the non-display area of the touch panel, and exposing another insulating layer by entirely removing at least one insulating layer of the plurality of insulating layers and an adhesive layer filling a space between the plurality of crack stoppers and the open area, the adhesive layer being disposed between the display panel and the touch panel.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on all the technical concepts as disclosed in the present disclosure and any equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A foldable display device, comprising:
a display panel including a folding area and a non-folding area, and including a display area and a non-display area;
a touch panel disposed on the display panel and including a bridge electrode, a plurality of insulating layers, a first touch electrode, and a second touch electrode, the plurality of insulating layers including a first inorganic insulating layer and a second insulating layer overlying the first inorganic insulating layer;
a plurality of crack stoppers disposed in the non-display area of the display panel, the plurality of crack stoppers including the same material and being in the same layer as the second insulating layers;

a space between each crack stopper of the plurality of crack stoppers, the space exposing a top surface of the first inorganic insulating layer, and an adhesive layer filling the space between the plurality of crack stoppers from which the insulating layers are removed, the adhesive layer being disposed between the display panel and the touch panel, wherein the adhesive layer extends as a continuous layer that is in contact with a top surface of the second insulating layer and also with the top surface of the first inorganic insulating layer where it is exposed by the space.

2. A foldable display device, comprising:

a display panel including a folding area and a non-folding area, and including a display area and a non-display area;

a touch panel disposed on the display panel and including a bridge electrode, a plurality of insulating layers, a first touch electrode, and a second touch electrode;

a plurality of crack stoppers disposed in the non-display area of the display panel and configured by patterning at least one of the plurality of insulating layers;

an adhesive layer filling a space between the plurality of crack stoppers from which the insulating layers are removed, the adhesive layer being disposed between the display panel and the touch panel;

a touch insulating layer;

an interlayer insulating layer on the bridge electrode;

an inorganic insulating layer on the first touch electrode and the second touch electrode; and a planarization layer on the inorganic insulating layer.

3. The foldable display device of claim 2, wherein the interlayer insulating layer is made of an organic layer.

4. The foldable display device of claim 2, wherein the non-display area includes a crack stopper area, and wherein the crack stoppers are disposed in the crack stopper area of the non-folding area.

5. The foldable display device of claim 2, wherein the crack stoppers are configured by patterning the touch insulating layer.

6. The foldable display device of claim 2, wherein the crack stoppers are configured by patterning the touch insulating layer and the interlayer insulating layer.

7. The foldable display device of claim 2, wherein the crack stoppers are configured by patterning the touch insulating layer, the interlayer insulating layer, the inorganic insulating layer, and the planarization layer.

8. The foldable display device of claim 4, wherein the crack stoppers are disposed to be parallel in a direction perpendicular to a direction toward the display area from the crack stopper area.

9. The foldable display device of claim 1, wherein the crack stoppers have a bar shape, a square shape, or an ellipse shape.

10. The foldable display device of claim 1, wherein the plurality of crack stoppers have several separate bar shapes spaced apart from each other.

11. The foldable display device of claim 1, wherein at least one of the plurality of crack stoppers have a single bar shape.

12. The foldable display device of claim 1, wherein the plurality of crack stoppers include a first crack stopper and a second crack stopper, wherein the plurality of crack stoppers are configured such that the first crack stopper and the second crack stopper are parallel and alternately disposed to each other, the first crack stopper and the second crack stopper includes a bar shape.

13. The foldable display device of claim 1, wherein the plurality of crack stoppers include a first crack stopper and a second crack stopper, wherein the first crack stopper and the second crack stopper are staggeredly disposed.

14. The foldable display device of claim 4, further comprising:

an open area exposing another insulating layer by at least partially or entirely removing at least one insulating layer of the plurality of insulating layers, wherein the adhesive layer fills the open area.

15. The foldable display device of claim 14, wherein the open area is disposed in the crack stopper area of the folding area.

16. The foldable display device of claim 14, wherein the open area exposes a surface of the interlayer insulating layer by entirely removing the touch insulating layer.

17. The foldable display device of claim 14, wherein the open area exposes a surface of the inorganic insulating layer by at least partially or entirely removing the touch insulating layer and the interlayer insulating layer.

18. The foldable display device of claim 14, wherein the open area is an area in which the touch insulating layer, the interlayer insulating layer, the inorganic insulating layer, and the planarization layer are entirely removed.

19. The foldable display device of claim 1, wherein the folding area includes a portion of the display area and a portion of the non-display area, the non-folding area includes a portion of the display area and a portion of the non-display area, and the non-folding area is an area located adjacent to both sides of the folding area.

20. A foldable display device comprising:

a display panel including a folding area and a non-folding area, and including a display area and a non-display area;

a touch panel disposed on the display panel and including a bridge electrode, a plurality of insulating layers, a first touch electrode, and a second touch electrode;

a plurality of crack stoppers disposed in the non-display area of the display panel and configured by patterning at least one of the plurality of insulating layers; and an adhesive layer filling a space between the plurality of crack stoppers from which the insulating layers are removed, the adhesive layer being disposed between the display panel and the touch panel;

wherein the adhesive layer includes a first portion corresponding to the non-folding area and a second portion corresponding to the folding area and wherein at least some of the second portion has a smaller Young's modulus value than the first portion.

21. The foldable display device of claim 2, wherein the interlayer insulating layer includes photo acryl which is an organic layer.

22. The foldable display device of claim 4, wherein the crack stopper area has a width of 45 μm to 100 μm.

23. A foldable display device, comprising:

a display panel divided into a folding area and a non-folding area, and divided into a display area and a non-display area;

a touch panel disposed on the display panel and including a plurality of insulating layers;

a plurality of crack stoppers disposed in the non-folding area of the touch panel, the plurality of crack stoppers are made of a same material as at least one of the plurality of insulating layers;

an open area disposed in the folding area of the non-display area of the touch panel, and exposing another insulating layer by entirely removing at least one insulating layer of the plurality of insulating layers; and an adhesive layer filling a space between the plurality of crack stoppers and the open area, the adhesive layer being disposed between the display panel and the touch panel, wherein the adhesive layer includes a first portion corresponding to the non-folding area and a second portion corresponding to the folding area, and wherein at least some of the second portion has a smaller Young's modulus value than the first portion.

24. The foldable display of claim 1, wherein the second insulating layer is an inorganic layer.

25. The foldable display of claim 24, further including:
a third insulating layer positioned between the first and second insulating layers, the third insulating layer being an organic layer.

* * * * *